(12) United States Patent
Taniguchi et al.

(10) Patent No.: US 9,716,350 B2
(45) Date of Patent: Jul. 25, 2017

(54) CONNECTOR HAVING A THERMAL PROTECTION CIRCUIT

(71) Applicant: Hosiden Corporation, Yao-shi, Osaka (JP)

(72) Inventors: Keiichi Taniguchi, Yao (JP); Tsuyoshi Kitagawa, Yao (JP); Hiroyuki Kaibara, Yao (JP)

(73) Assignee: HOSIDEN CORPORATION, Yao-Shi (JP)

( * ) Notice: Subject to any disclaimer, the term of this patent is extended or adjusted under 35 U.S.C. 154(b) by 2 days.

(21) Appl. No.: 14/674,646

(22) Filed: Mar. 31, 2015

(65) Prior Publication Data

US 2015/0288110 A1  Oct. 8, 2015

(30) Foreign Application Priority Data

Apr. 3, 2014 (JP) .................................. 2014-076668
Sep. 30, 2014 (JP) .................................. 2014-201225

(51) Int. Cl.
*H01R 13/66* (2006.01)
*H01R 13/713* (2006.01)
(Continued)

(52) U.S. Cl.
CPC ......... *H01R 13/7137* (2013.01); *H01R 13/46* (2013.01); *H01R 13/6683* (2013.01); *H01R 24/64* (2013.01)

(58) Field of Classification Search
CPC   H01R 13/7137; H01R 13/66; H01R 13/6666; H01R 13/6683
(Continued)

(56) References Cited

U.S. PATENT DOCUMENTS 7,416,353 B2 *  8/2008  Yoshikawa .......... G02B 6/4201
                                                      385/14
7,540,788 B2 *  6/2009  Murphy ............... H01R 13/504
                                                      439/676
(Continued)

FOREIGN PATENT DOCUMENTS

JP    2000-188852    7/2000
JP    2009-93826     4/2009

OTHER PUBLICATIONS

European Search Report dated Aug. 4, 2015, 8 pages.

*Primary Examiner* — Vanessa Girardi
(74) *Attorney, Agent, or Firm* — Rankin, Hill & Clark LLP

(57) ABSTRACT

The invention relates to a connector including a thermal protection circuit which detects abnormal heating to cut off the power supply. The connector (200) of the invention has: a cover portion (21); a plug portion (22); and a printed circuit board (27). The thermal protection circuit includes: an FET (34) which is inserted in a power supply line of a printed circuit board; and a temperature switch IC (33) which detects a temperature, and which, when the detected temperature exceeds a predetermined temperature, outputs an abnormal heating signal for causing the FET to cut off the power supply line. The connector includes a metal bonding member (360) which thermally couples a metal shell (25) to the temperature switch IC (33). The connector in which power supply can be cut off with high sensitivity with respect to abnormal heating in a plug portion is provided.

7 Claims, 19 Drawing Sheets

(51) Int. Cl.
*H01R 13/46* (2006.01)
*H01R 24/64* (2011.01)

(58) Field of Classification Search
USPC ..... 439/620.22, 620.06, 620.3; 361/103–106
See application file for complete search history.

(56) References Cited

U.S. PATENT DOCUMENTS

| | | | |
|---|---|---|---|
| 7,717,717 B1* | 5/2010 | Lai | H01R 13/64 |
| | | | 439/66 |
| 8,498,087 B2* | 7/2013 | Rabu | H01R 13/7137 |
| | | | 361/104 |
| 2008/0096429 A1 | 4/2008 | Mikolajczak et al. | |
| 2011/0104940 A1 | 5/2011 | Rabu et al. | |

\* cited by examiner

CONNECTOR HAVING A THERMAL PROTECTION CIRCUIT

TECHNICAL FIELD

The present invention relates to a connector including a thermal protection circuit which detects abnormal heating to cut off the power supply.

BACKGROUND ART

U.S. Pat. No. 8,498,087 discloses a connector of this kind in which a thermal protection circuit is mounted on a printed circuit board for connecting cable conductors to connector pins, the thermal protection circuit includes a temperature sensor (thermistor) and a power cutoff switch (FET), the cutoff switch is interposed in a board power supply path for conductively connecting a cable conductor for a power supply (VBUS) to the connector pin, and, when the temperature sensor detects a temperature higher than a predetermined temperature, the power (current) supply is cut off by the cutoff switch.

SUMMARY OF THE INVENTION

In the case where a connector includes a thermal protection circuit, it is necessary to, as seen in a conventional connector, incorporate the thermal protection circuit into a portion where the connector is to be connected to a cable (hereinafter, such a portion is referred to a cable connecting portion). Therefore, a thermal protection circuit of a connector is prone to show a higher sensitivity to abnormal heating in a cable connecting portion, and a lower sensitivity to abnormal heating in a portion where the circuit is connected to a mating connector (hereinafter, such a portion is referred to a mating-connector connecting portion). A conventional connector does not include a structure for positively and efficiently transmitting heat of the mating-connector connecting portion to a temperature sensor of a thermal protection circuit, and therefore has a problem in that the power supply cannot be cut off with high sensitivity with respect to abnormal heating in the mating-connector connecting portion.

In a connector which has a small size and low strength, and in which a mating-connector connecting portion is therefore easily deformable, such as a micro USB plug, particularly, there is a case where, in a state where the connector is not connected (fitted) to a mating connector, a protection circuit which is usually incorporated into an output-side device does not operate, and a mating-connector connecting portion abnormally generates heat, thereby causing the problem in that the power supply cannot be cut off with high sensitivity with respect to abnormal heating in the mating-connector connecting portion.

It is an object of the invention to provide a connector in which heat of a mating-connector connecting portion can be positively and efficiently transmitted to a temperature sensor of a thermal protection circuit, and power supply can be cut off with high sensitivity with respect to abnormal heating in the mating-connector connecting portion.

First solving means is the connector of the first invention. The connector has: a cover portion (cable connecting portion) into which one end of a cable is inserted, and which is made of an insulating synthetic resin; a plug portion (mating-connector connecting portion) which is supported in a state where the plug portion is projected from a tip end of the cover portion, which is to be inserted into a mating connector, and which includes: an insulator; a plurality of contact terminals that are supported by the insulator; and a metal shell which covers an outer circumference side of the insulator; and a printed circuit board which is placed in the cover portion, and on which a thermal protection circuit is mounted, the thermal protection circuit includes: an FET which is inserted in a power supply line of the printed circuit board; and a temperature switch IC which detects a temperature, and which, when the detected temperature exceeds a predetermined temperature, outputs an abnormal heating signal for causing the FET to cut off the power supply line, and is characterized in that the connector further includes a metal bonding member which thermally couples the metal shell to the temperature switch IC.

Here, it is preferable that the FET is incorporated in the temperature switch IC (the connector of the third invention which is third solving means).

Second solving means is the connector of the second invention. The connector is characterized in that, in the connector of the first invention, the metal bonding member is configured by a metal plate member which is formed integrally with the metal shell, which extends from the metal shell into the cover portion so as to be opposed to the temperature switch IC, and in which a heat transmitting portion that is in contact with the temperature switch IC is formed.

Fourth solving means is the connector of the fourth invention. The connector is characterized in that, in the connector of the first invention, the metal bonding member is configured by a metal plate member which is formed integrally with the metal shell, which extends from the metal shell into the cover portion so as to be opposed to the temperature switch IC, and in which a heat transmitting portion that is in contact with the temperature switch IC is formed, and the heat transmitting portion is configured by an elastic piece.

Fifth solving means is the connector of the fifth invention. The connector is characterized in that, in the connector of the first invention, the metal bonding member is configured by a metal plate member which is formed integrally with the metal shell, which extends from the metal shell into the cover portion so as to be opposed to the temperature switch IC, and in which a heat transmitting portion that is in contact with the temperature switch IC is formed, and the connector further includes a thermally conductive resin sheet which is stuck to a contact surface of one of the heat transmitting portion and the temperature switch IC, and interposed between the contact surfaces of the heat transmitting portion and the temperature switch IC.

Sixth solving means is the connector of the sixth invention. The connector is characterized in that the connector of the first invention is a plug according to the micro USB standard.

Seventh solving means is the connector of the seventh invention. The connector is characterized in that, in the connector of the first sixth invention, the metal bonding member is configured by a metal plate member which is formed separately from the metal shell, which is integrated with the metal shell, and which extends from the metal shell to the temperature switch IC.

According to the connector of the first invention, the metal shell which is a cover for the plug portion is thermally coupled to the temperature switch IC by the metal bonding member. Therefore, heat of the plug portion can be positively and efficiently transmitted to the temperature switch IC. The power supply can be cut off with high sensitivity with respect to abnormal heating in the plug portion. Furthermore, the power supply can be cut off with high sensitivity, also with respect to abnormal heating on the side of the mating connector.

According to the connector of the third invention, the temperature switch IC and the FET can be formed into one chip.

According to the connector of the second invention, the metal bonding member and the metal shell are integrated into a single component, and therefore the connector can include the metal bonding member without increasing the numbers of components of the connector and steps of assembling the connector.

According to the connector of the fourth invention, the heat transmitting portion is configured by an elastic piece, and therefore the heat transmitting portion can be surely contacted (in close contact) with the temperature switch IC while absorbing variations of the product dimensions of the connector. In assembling of the connector, moreover, it is possible to prevent the heat transmitting portion from applying an excessive load on the temperature switch IC.

According to the connector of the fifth invention, the thermally conductive resin sheet is stuck to one of the contact surfaces of the heat transmitting portion and the temperature switch IC. In assembling of the connector, therefore, the thermally conductive resin sheet can function as a shock-absorbing member to prevent the heat transmitting portion from applying an excessive load on the temperature switch IC.

According to the connector of the sixth invention, since the connector is a plug according to the micro USB standard, abnormal heating can be detected in the micro USB plug to cut off the power supply. Moreover, the power supply can be cut off with high sensitivity with respect to abnormal heating in the plug portion.

According to the connector of the seventh invention, since the metal bonding member is formed separately from the metal shell, the production costs of the metal bonding member and the metal shell can be reduced as compared with the case where the metal bonding member and the metal shell are formed integrally with each other.

DESCRIPTION OF PREFERRED EMBODIMENTS

Hereinafter, embodiments of the invention will be described with reference to the drawings.

A connector of an embodiment of the invention is a plug according to the micro-USB (2.0) standard. Therefore, a mating connector is a receptacle according to the micro-USB (2.0) standard. Hereinafter, a connector of an embodiment of the invention is referred to as "plug", and a mating connector for the plug is referred to as "receptacle". The plug is inserted into the receptacle in a state where the plug is opposed to the receptacle. In the specification, the sides of the plug and the receptacle where they are opposed to each other are referred to as "front", and the respective opposite sides are referred to as "rear".

Figure 1:
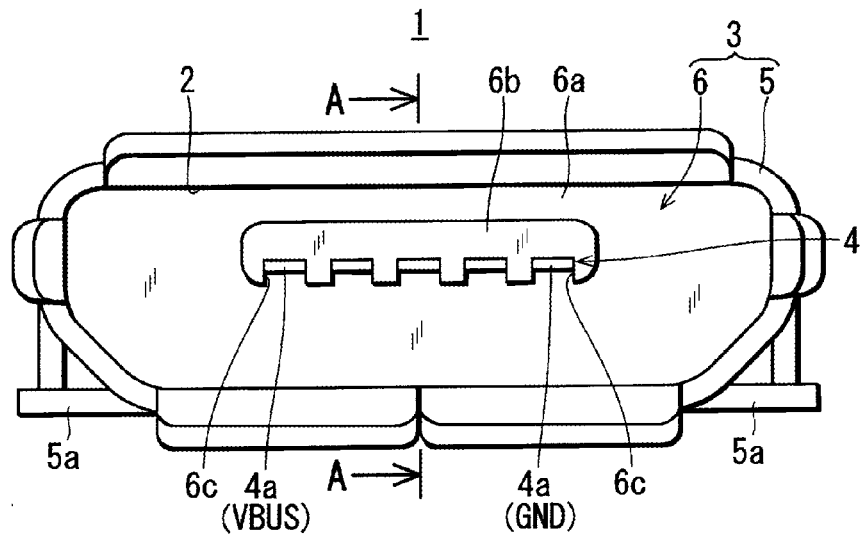
FIG. 1 is a front view of a mating connector to which a connector of an embodiment of the invention is to be connected.

First, the receptacle to which the plug of the embodiment of the invention is to be connected will be described with reference to FIGS. 1, 2, and 12. FIG. 1 is a front view of the receptacle, FIG. 2 is a sectional view taken along line A-A in FIG. 1, and FIG. 12 is a sectional view showing a connection state of the plug.

Figure 2:
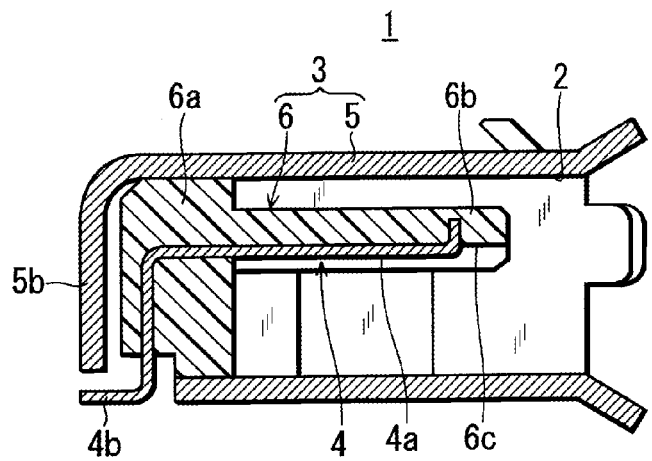
FIG. 2 is a sectional view taken along line A-A in FIG. 1.
Figure 12:
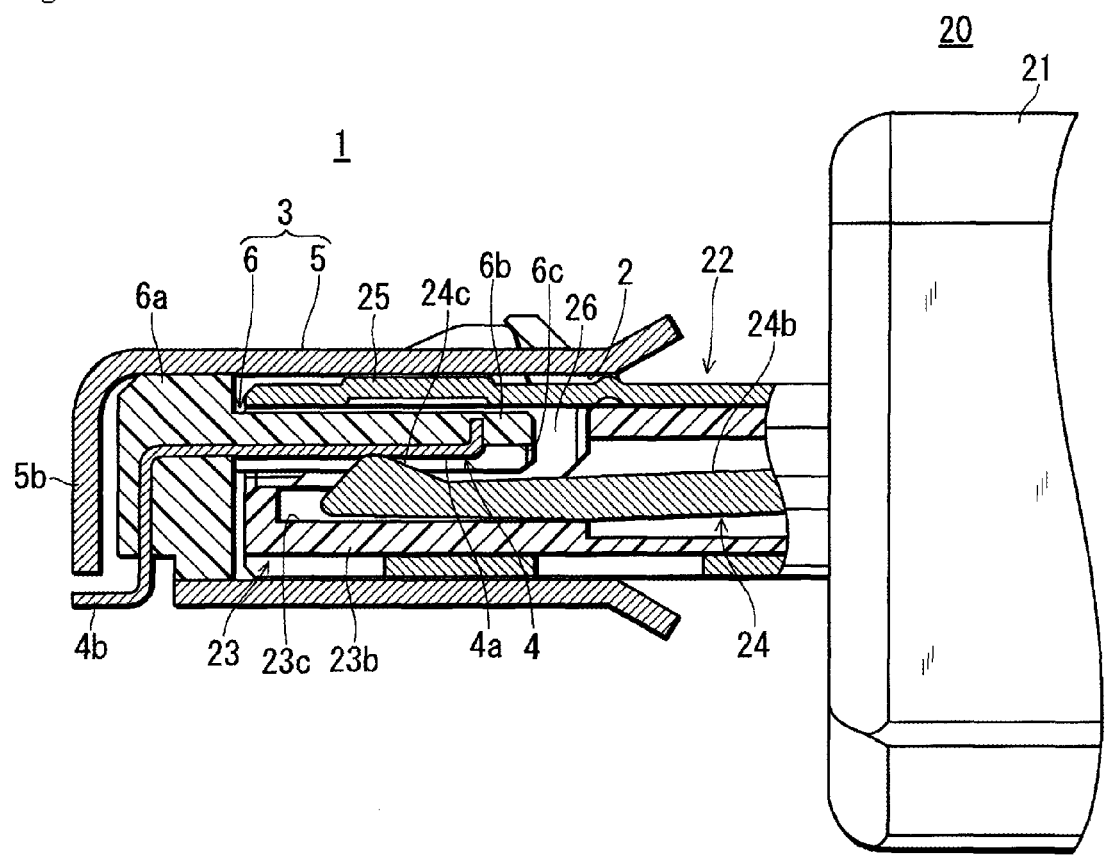
FIG. 12 is a sectional view showing a connection state of the connector.

As shown in FIGS. 1, 2, and 12, the receptacle 1 includes a housing 3 in which a plug inserting portion 2 into which the plug 20 is to be inserted is formed in the front side, and five receptacle-side contacting terminals 4 which are supported by the housing 3, and which are exposed in the plug inserting portion 2. The housing 3 is configured by a tubular receptacle-side metal shell 5 which is a shielding member that is formed by punching and bending a conductive metal plate into a predetermined shape; and a receptacle body 6 which is an insulator supporting the receptacle-side contacting terminals 4.

In the receptacle-side metal shell 5, board connecting terminals 5a which are to be connected to a circuit board, and a rear surface cover 5b are integrally formed.

In the receptacle body 6, a rear wall portion 6a which is fitted into a rear end portion of the receptacle-side metal shell 5, and a terminal supporting portion 6b which is projected from the front surface of the rear wall portion 6a, and which has a planar shape are integrally formed, and the terminal supporting portion 6b is supported in a state where the portion is projected into the plug inserting portion 2. In the receptacle body 6, moreover, five longitudinal terminal accommodating grooves 6c which are laterally arranged are formed on the lower surface of the terminal supporting portion 6b. The receptacle body 6 is molded from an insulating synthetic resin material.

The receptacle-side contacting terminals 4 are formed by punching and bending a conductive metal plate into a predetermined shape, and then insert-molded integrally with the receptacle body 6 to be supported thereby. Each of the receptacle-side contacting terminals 4 is in a state where a contact piece 4a which is to be contacted with a plug-side contacting terminal 24 is embedded and fixed into the lower surface of the terminal supporting portion 6b while the lower surface of the terminal is exposed along the corresponding terminal accommodating groove 6c, and a board connection piece 4b which is to be contacted with the circuit board is extracted from a lower portion of the rear wall portion 6a to the outside.

The receptacle-side contacting terminals 4 are arranged laterally in a row in the sequence of, from the left side toward the right side in FIG. 1, terminal No. 1 for power supply (VBUS), terminal No. 2 for a differential signal (D−), terminal No. 3 for a differential signal (D+), terminal No. 4 for identification (ID), and terminal No. 5 for grounding (GND).

The receptacle 1 is assembled in the following manner. The receptacle body 6 with which the receptacle-side contacting terminals 4 are integrally formed is inserted into the receptacle-side metal shell 5 from a rear end opening. The rear wall portion 6a is fitted into a rear end portion of the receptacle-side metal shell 5. The rear surface of the rear wall portion 6a is covered by the rear surface cover 5b. The receptacle body 6 is fixed into the receptacle-side metal shell 5.

The thus configured receptacle 1 may be mounted in a small portable electronic device such as a portable telephone, particularly a smart phone, or a tablet terminal, for the purpose of charging or data communication. Specifically, the receptacle is mounted in an edge portion of a printed circuit board which is incorporated together with a secondary battery into a case of the device, and the plug inserting portion 2 is opened in a plug insertion port disposed in a side surface of the case. The receptacle 1 is mounted on the circuit board by soldering the board connection piece 4b and the board connecting terminals 5a to a receptacle connecting portion configured by lands and through holes disposed on the board, respectively.

Figure 3:
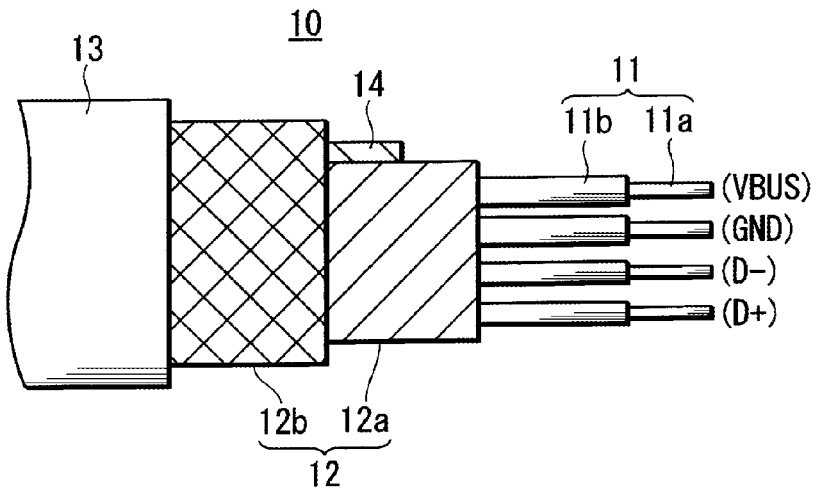
FIG. 3 is a diagram of a cable in which the connector is to be disposed.

Then, a cable in which the plug of the embodiment of the invention is to be disposed will be described with reference to FIG. 3. FIG. 3 is a diagram of the cable.

As shown in FIG. 3, the cable 10 is a cable according to the micro-USB (2.0) standard, and configured by four core wires 11, a shield 12, a reinforcing wire 14, and a sheath 13.

Each of the core wires 11 is an insulated wire in which a conductor 11a is covered with an insulator 11b. For example, the conductor 11a is configured by tinned copper wires or the like, and the insulator 11b is made of polyvinyl chloride. The four core wires 11 are used for power supply (Vcc), grounding (GND), and paired differential signals (D−) and (D+), respectively. The paired core wires 11 are disposed in the cable 10 in a state where they are parallel to each other or twisted together.

The shield 12 has a double structure including an inner shield 12a and an outer shield 12b. The inner shield 12a is configured by, for example, an aluminum foil tape, and wound around the core wires 11 to cover them. The outer shield 12b is configured by, for example, a braided tube in which tinned copper wires are braided, and covers the circumference of the inner shield 12a.

The reinforcing wire 14 is configured by a metal wire having a circular sectional shape, and embedded between the inner shield 12a and outer shield 12b of the shield 12.

The sheath 13 which is a protective coating of the cable 10 is made of an insulating material such as polyvinyl chloride, and covers the circumference of the shield 12.

Figure 4:
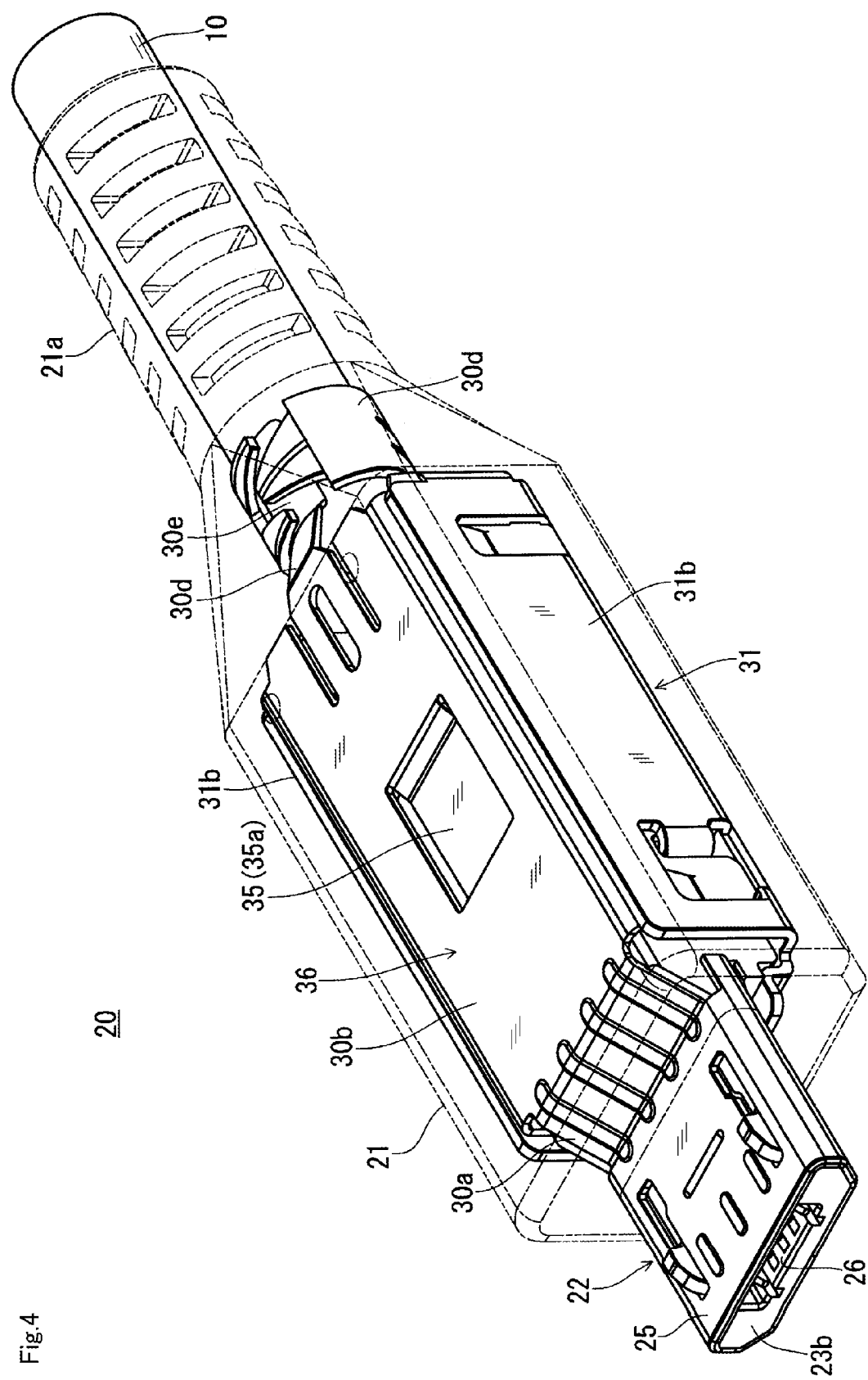
FIG. 4 is a perspective view of the connector.
Figure 5:
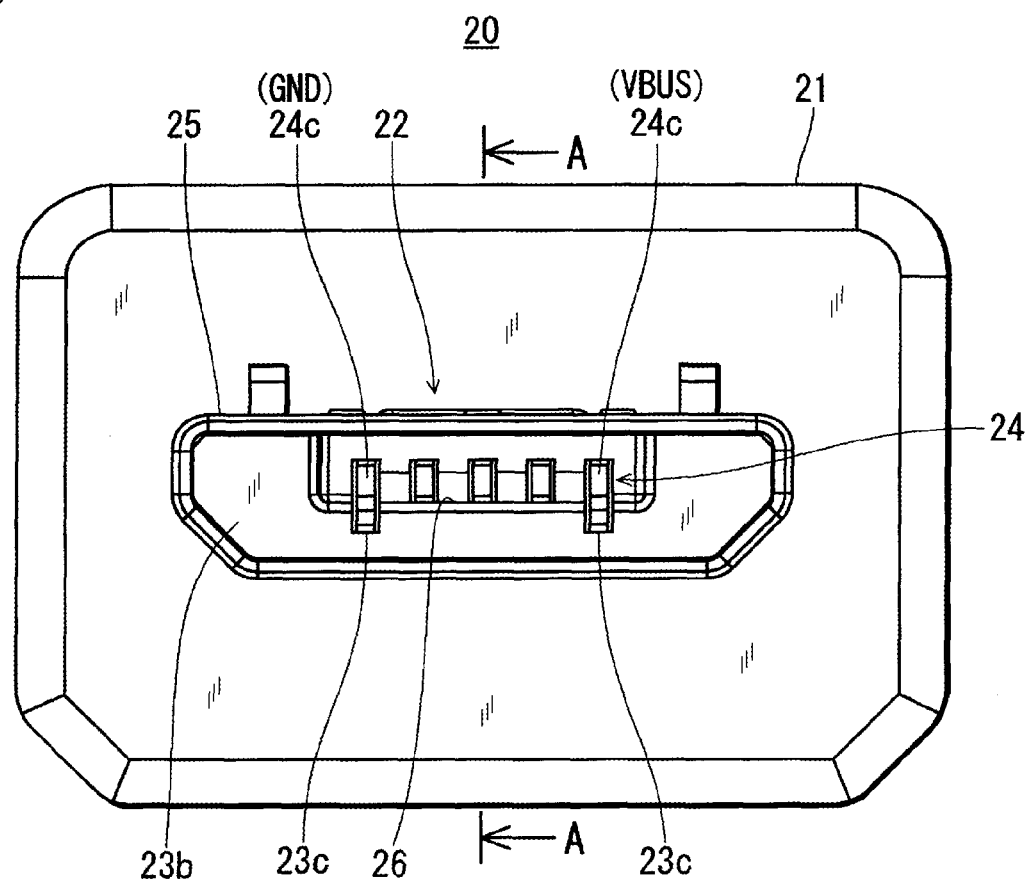
FIG. 5 is a front view of the connector.
Figure 6:
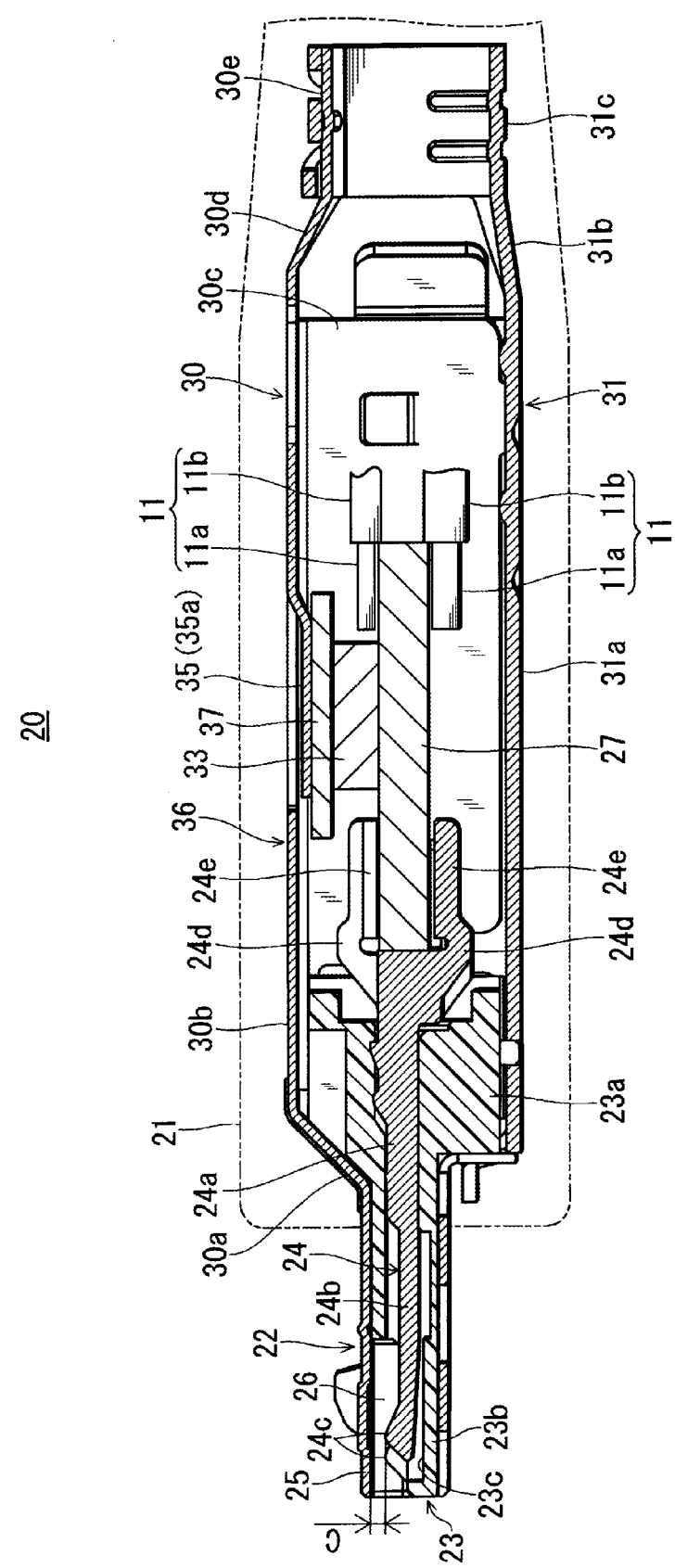
FIG. 6 is a sectional view taken along line A-A in FIG. 5.
Figure 7:
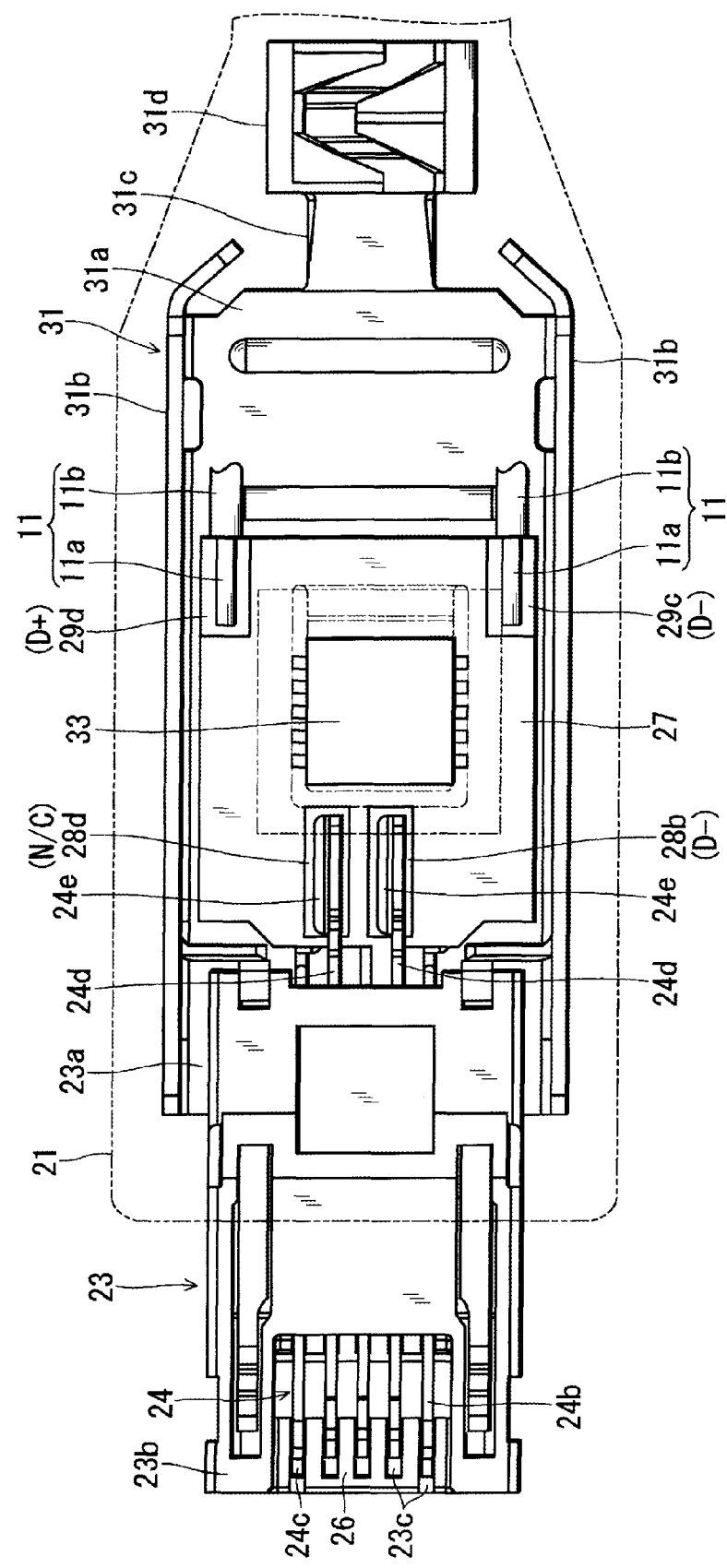
FIG. 7 is a plan view of the connector.
Figure 8:
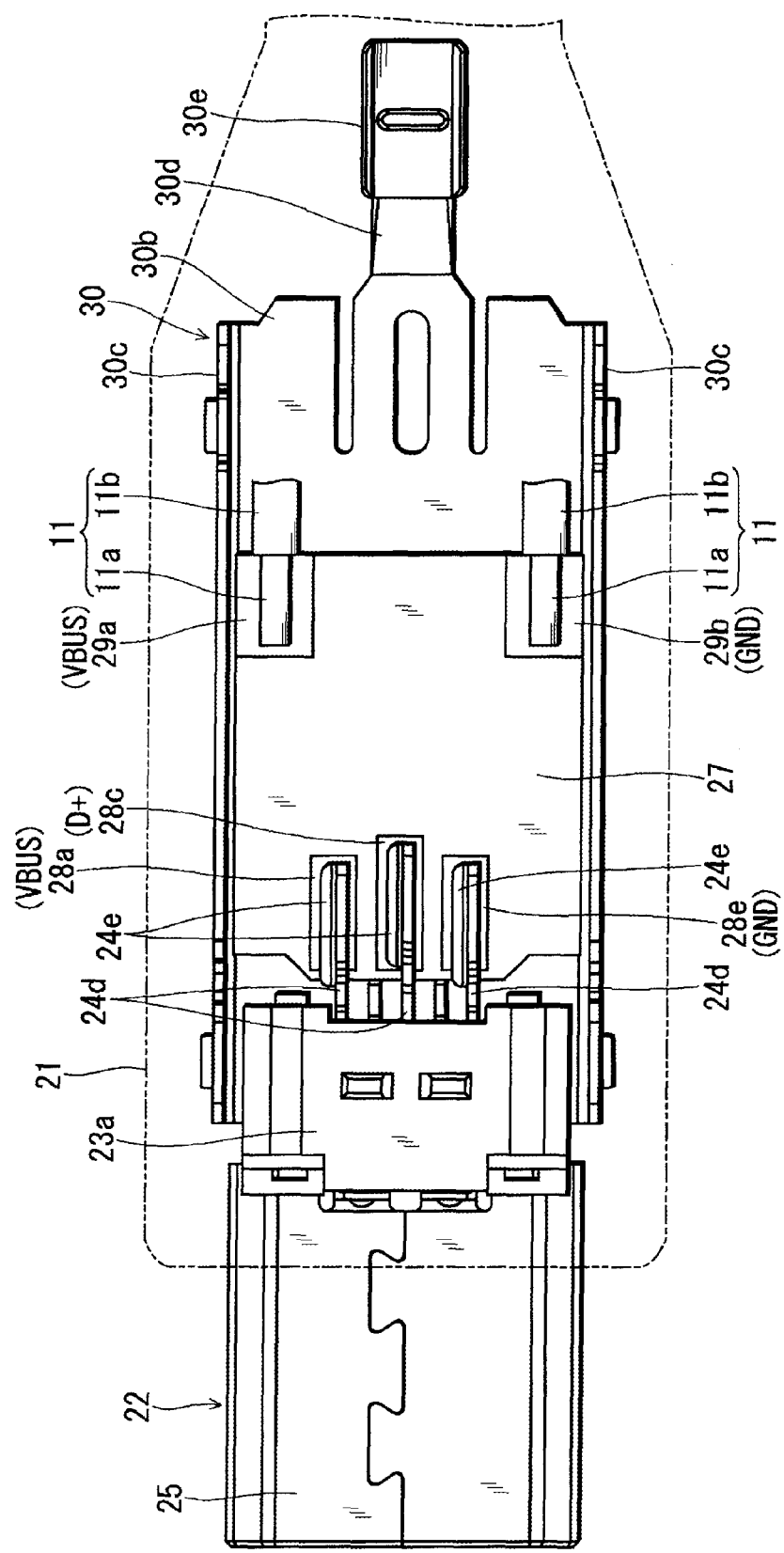
FIG. 8 is a bottom view of the connector.
Figure 9:
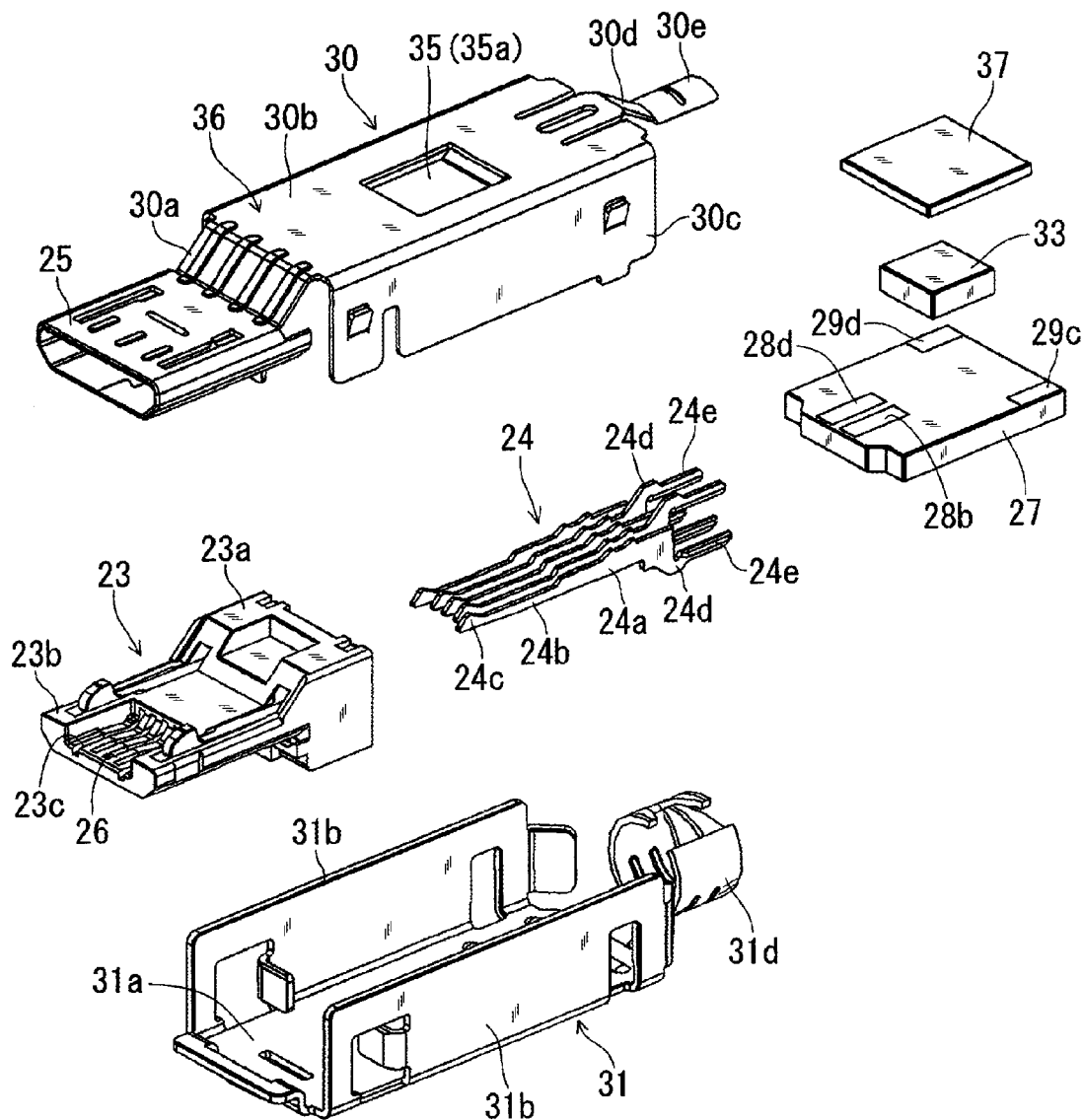
FIG. 9 is an exploded perspective plan view of the connector.
Figure 10:
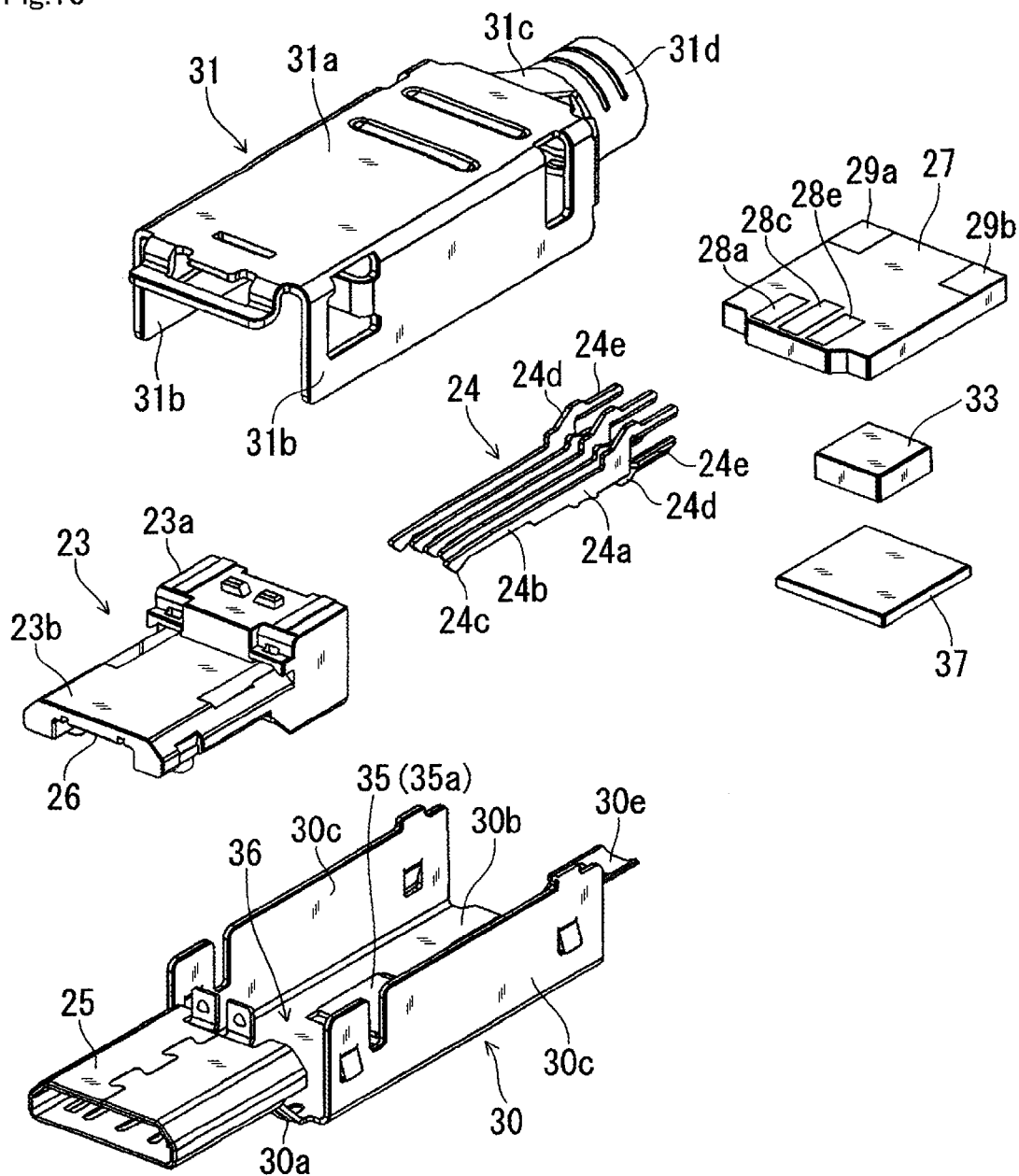
FIG. 10 is an exploded perspective bottom view of the connector.
Figure 11:
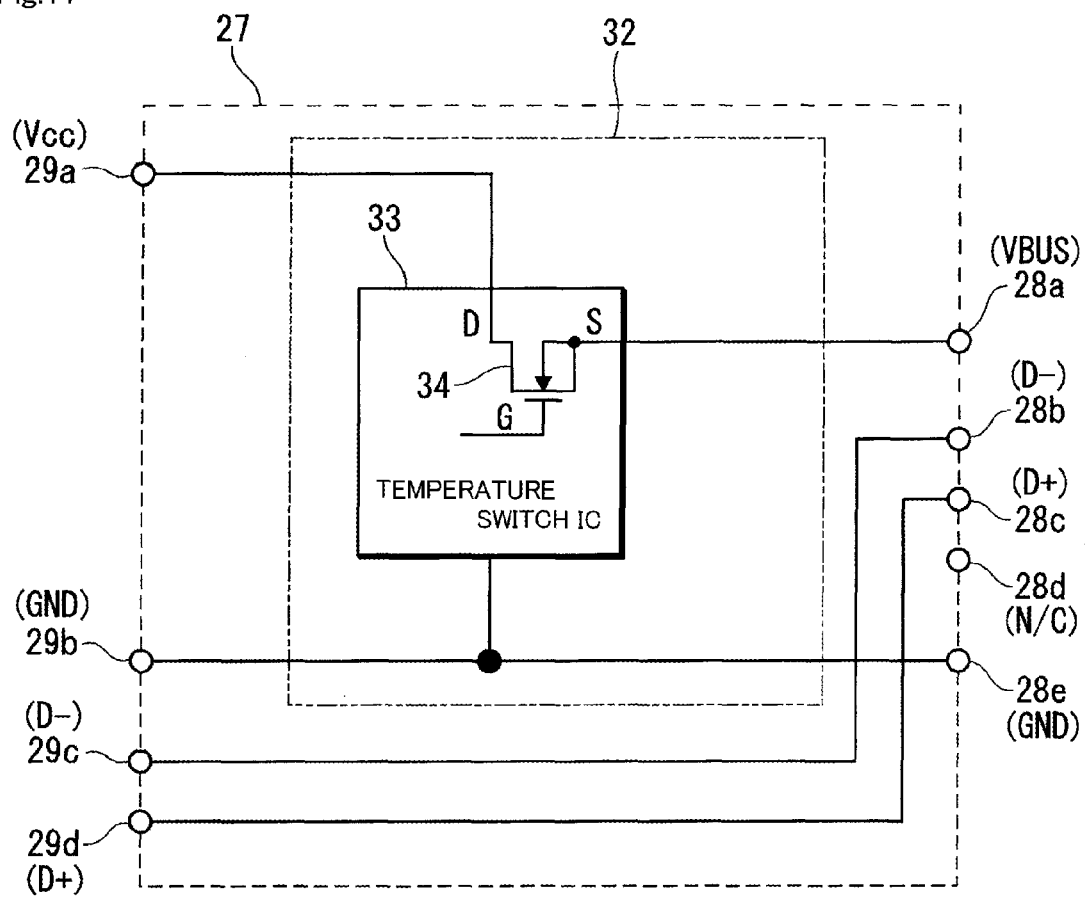
FIG. 11 is a circuit diagram showing a thermal protection circuit.
Figure 13:
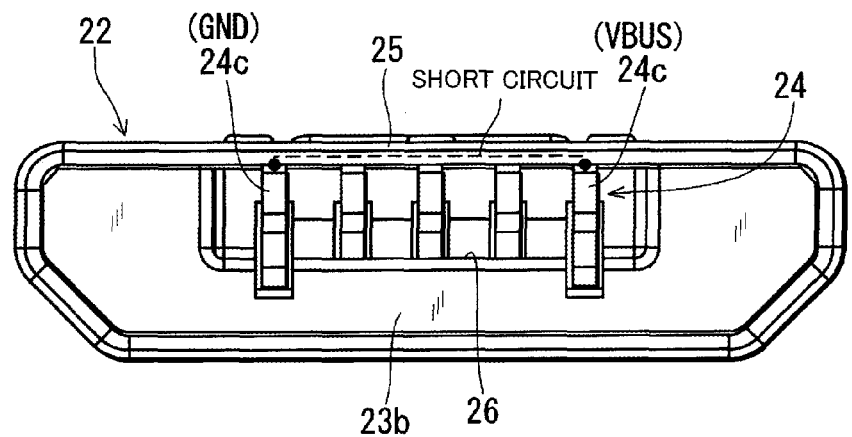
FIG. 13 is a front view showing an abnormal heating state in a plug portion.
Figure 14:
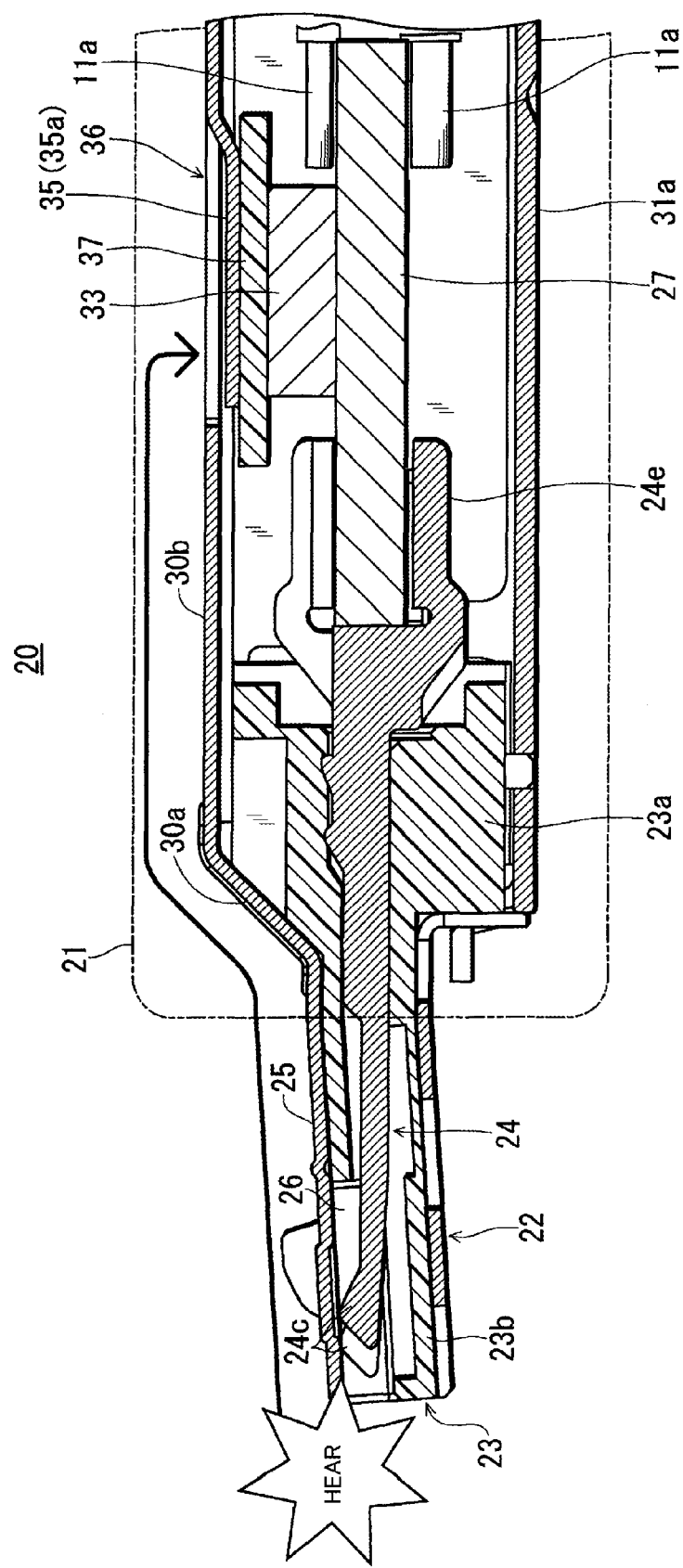
FIG. 14 is a sectional view showing the function of a metal bonding member of the connector.

Hereinafter, the plug which is the embodiment of the invention will be described with reference to FIGS. 4 to 14. FIG. 4 is a perspective view showing the appearance of the plug in a state where a cover portion is made semitransparent (indicated by dash-dot-dot lines), FIG. 5 is a front view showing the appearance of the plug, FIG. 6 is a sectional view showing the internal structure of the plug and taken along line A-A in FIG. 5, FIG. 7 is a plan view showing the internal structure of the plug in a state where a plug-side metal shell is made transparent, FIG. 8 is a bottom view showing the internal structure of the plug in a state where a shell cover is made transparent, FIG. 9 is a perspective plan view showing the configuration of the plug in an exploded state, FIG. 10 is a perspective bottom view showing the configuration of the plug in an exploded state, FIG. 11 is a circuit diagram showing a thermal protection circuit, FIG. 12 is a sectional view showing the connection state of the plug as described above, FIG. 13 is a front view showing an abnormal heating state in a plug portion, and FIG. 14 is a sectional view showing the function of a metal bonding member of the plug.

As shown in FIG. 4, the plug 20 has a cover portion 21 into which one end of the cable 10 is inserted, and which is made of an insulating synthetic resin, and a plug portion 22 which is supported in a state where the plug portion is projected from the tip end (front end) of the cover portion 21. As shown in FIG. 12, the plug portion 22 is inserted into the receptacle 1, specifically, inside the receptacle-side metal shell 5, i.e., into the plug inserting portion 2.

As shown in FIGS. 4 to 10, the plug portion 22 includes: the plug body 23 which is an insulator; five plug-side contacting terminals 24 which are supported by the plug body 23; and a tubular plug-side metal shell 25 which is a shielding member covering the outer circumference of the plug body 23. A terminal supporting portion inserting portion 26 which is opened in the front side is formed in the plug portion. As shown in FIG. 12, a terminal supporting portion 6b which is projected into the plug inserting portion 2 is inserted into the terminal supporting portion inserting portion.

In the plug body 23, as shown in FIGS. 4 to 10, a block-like cable connecting portion basal portion 23a which is placed in an inner front end part of the cover portion 21, and a planar plug basal portion 23b which is projected from the front surface of the cable connecting portion basal portion 23a are integrally formed, and the plug basal portion 23b is supported in a state where the portion is projected from a central portion of the front end surface of the cover portion 21. In the plug body 23, moreover, a terminal supporting portion inserting portion 26 having a concave shape which is opened in the upper and front sides is formed in the upper surface of the plug basal portion 23b. In the plug body 23, as shown in FIGS. 5 to 7 and 9, five terminal housing portions 23c which longitudinally extend from the cable connecting portion basal portion 23a toward the plug basal portion 23b are formed in a laterally arranged manner. The rear ends of all the five terminal housing portions 23c are opened in the rear end surface of the cable connecting portion basal portion 23a, and in the cover portion 21. The front ends of the two end ones of the terminal housing portions 23c are forwardly opened in the front end surface of the plug basal portion 23b, and those of the three central ones of the terminal housing portions 23c do not reach the front end surface of the plug basal portion 23b, and are located just in rear of the front end surface and closed. The terminal housing portions 23c are in a state where upper front portions of all the five terminal housing portions are cut away by the terminal supporting portion inserting portion 26, and opened in the two surfaces or the lower and rear wall surfaces of the terminal supporting portion inserting portion 26. The plug body 23 is molded from an insulating synthetic resin material. Alternatively, the front ends of all the five terminal housing portions 23c may be forwardly opened in the front end surface of the plug basal portion 23b.

As shown in FIGS. 4 to 6 and 8 to 10, the plug-side metal shell 25 is formed by punching a conductive metal plate into a predetermined shape, and bending the punched plate into a tubular shape. As shown in FIGS. 4 to 6, the outer circumference of the plug basal portion 23b is covered by the plug-side metal shell 25, thereby obtaining a state where the terminal supporting portion inserting portion 26 is opened only in the front side. A rear end portion of the plug-side metal shell 25 is placed in an inner front end part of the cover portion 21.

As shown in FIGS. 5 to 7, the plug-side contacting terminals 24 are inserted into the terminal housing portions 23c from the rear end openings, respectively, and attached to and supported by the plug body 23 in a state where the terminals are arranged laterally in a row. Each of the plug-side contacting terminals 24 is formed by punching and bending a conductive metal plate into a predetermined shape. In the plug-side contacting terminal 24, as shown in FIGS. 5 to 10, a basal portion 24a which longitudinally extends, and which is fixed to the plug body 23, an elastic contact piece 24b which forwardly extends from the front end of the basal portion 24a, and which is vertically displaceable, a contacting portion 24c which is disposed on the front end (tip end) of the elastic contact piece 24b in a state where it is upwardly projected, and a board connection piece 24e which rearwardly extends from the rear end of the basal portion 24a are integrally formed. As shown in FIGS. 5 to 7, the terminal 24 is in a state where the basal portion 24a is pressingly inserted into a rear part of the corresponding terminal housing portion 23c, and fixed to the cable connecting portion basal portion 23a so as to be prevented from slipping off therefrom, the elastic contact piece 24b is inserted into a front part of the corresponding terminal housing portion 23c, and exposed from the lower side in the terminal supporting portion inserting portion 26 in a state where the piece is vertically and elastically displaceable with respect to the plug basal portion 23b, the contacting portion 24c is upwardly projected from the lower side in a front end part of the terminal supporting portion inserting portion 26, and the board connection piece 24e is projected from the rear end surface of the cable connecting portion basal portion 23a into the cover portion 21.

The plug-side contacting terminals 24 are arranged laterally in a row in the sequence of, from the right side toward the left side in FIG. 5, terminal No. 1 for power supply (VBUS), terminal No. 2 for a differential signal (D−), terminal No. 3 for a differential signal (D+), terminal No. 4 for identification (ID), and terminal No. 5 for grounding (GND).

In the terminal supporting portion inserting portion 26, as shown in FIGS. 5 and 6, the plug-side metal shell 25 is exposed from the upper side, and the contacting portions 24c of the plug-side contacting terminals 24 are exposed from the lower side. The plug-side contacting terminals 24 are supported by the plug body 23 in a state where a spatial distance C for insulation is formed between the contacting portions 24c and the plug-side metal shell 25 which is above the contacting portions.

In the cover portion 21, as shown in FIG. 4, a cable bush 21a that is a portion into which the cable is to be inserted is integrally formed in a state where the bush is rearwardly projected from the rear end of the portion.

As shown in FIGS. 6 to 10, the plug 20 includes a printed circuit board 27 which is placed in the cover portion 21, and through which the plug-side contacting terminals 24 and the conductors 11a of the core wires 11 in the cable 10 are connected to each other.

In each of the plug-side contacting terminals 24, as shown in FIGS. 6 to 10, a row converting portion 24d is integrally formed between the basal portion 24a and the board connection piece 24e, and causes the board connection piece 24e to be projected in one of two vertical stages into the cover portion 21 from the rear end surface of the cable connecting portion basal portion 23a. Specifically, the board connection pieces 24e for the terminal No. 2 for a differential signal (D−) and the terminal No. 4 for identification (ID) are caused by their row converting portions 24d to be rearwardly projected at a position which is higher in level than the respective basal portions 24a, and laterally arranged in one upper row, and the board connection pieces 24e for the terminal No. 1 for power supply (VBUS), the terminal No. 3 for a differential signal (D+), and the terminal No. 5 for grounding (GND) are caused by their row converting portions 24d to be rearwardly projected at a position which is lower in level than the respective basal portions 24a, and laterally arranged in one lower row. A gap corresponding to the thickness of the printed circuit board 27 is disposed between the board connection pieces 24e in the upper stage and those in the lower stage.

As shown in FIGS. 6 to 8, the printed circuit board 27 is supported just in rear of the plug body 23 in a state where the central part of the front portion is inserted into the gap between the board connection pieces 24e in the upper stage and those in the lower stage, the both surfaces are vertically directed, and the whole is rearwardly projected from the rear end surface of the cable connecting portion basal portion 23a in a direction opposite to the plug basal portion 23b.

On the upper surface of the printed circuit board 27, as shown in FIGS. 7 and 9, two terminal connecting portions (lands) 28b, 28d are formed in a front central part in a laterally arranged manner, and two cable connecting portions (lands) 29b, 29c are formed in both rear corner parts, respectively. On the lower surface of the printed circuit board 27, as shown in FIGS. 8 and 10, three terminal connecting portions (lands) 28a, 28c, 28e are formed in a front central part in a laterally arranged manner, and two cable connecting portions (lands) 29a, 29d are formed in both rear corner parts, respectively. The five terminal connecting portions 28a to 28e are used for power supply (VBUS), a differential signal (D−), a differential signal (D+), identification (ID), and grounding (GND) in the order of the reference numerals (alphabetical order). The four cable connecting portions 29a to 29d are used for power supply (Vcc), grounding (GND), a differential signal (D−), and a differential signal (D+) in the order of the reference numerals (alphabetical order).

As shown in FIGS. 6 and 7, the board connection pieces 24e which are placed in the upper stage are connected by soldering to the terminal connecting portions 28b, 28d that are correspondingly formed on the upper surface of the printed circuit board 27, respectively. As shown in FIGS. 6 and 8, the board connection pieces 24e which are placed in the lower stage are connected by soldering to the terminal connecting portions 28a, 28c, 28e that are correspondingly formed on the lower surface of the printed circuit board 27, respectively. As a result, as shown in FIGS. 6 to 8, the printed circuit board 27 is supported and fixed just in rear of the plug body 23 in the above-described state through the five plug-side contacting terminals 24. As shown in FIGS. 6 to 8, moreover, the conductors 11a of the core wires 11 which are exposed on the side of the one end of the cable 10 are connected by soldering to the corresponding cable connecting portions 29a to 29d of the printed circuit board 27, respectively. As a result, as shown in FIG. 11, the printed circuit board 27 causes the four plug-side contacting terminals 24 other than the terminal for identification, and the conductors 11a of the four core wires 11 corresponding to the terminals to be respectively conductively connected to each other. The terminal connecting portion 28d for identification is set as an idle terminal (N/C: Not Connected) which is not connected to any terminal.

As shown in FIGS. 4 and 6, the plug 20 further includes a cable connecting portion metal cover portion 30 and shell cover 31 which, in the cover portion 21, cover the outer circumference of the printed circuit board 27 from the outer circumferential side of the cable connecting portion basal portion 23a, and also the outer circumferences of the four core wires 11 which are exposed on the side of the one end of the cable 10.

The cable connecting portion metal cover portion 30 is formed integrally with the plug-side metal shell 25, and, as shown in FIGS. 4, 6, and 8 to 10, integrally has: a metal cover portion connecting piece 30a which is bent from the rear end upper edge of the plug-side metal shell 25, to rise along the front surface of the cable connecting portion basal portion 23a; a cable connecting portion upper surface cover portion 30b which is bent from the upper end edge of the metal cover portion connecting piece 30a to rearwardly extend along the upper surface of the cable connecting portion basal portion 23a; and a pair of cable connecting portion side surface inner cover portions 30c which are bent from the lateral side edges of the cable connecting portion upper surface cover portion 30b to downwardly extend along the lateral side surfaces of the cable connecting portion basal portion 23a, respectively. The cable connecting portion metal cover portion 30 has a U-like shape which is opened in the front, rear, and lower sides.

The shell cover 31 is formed by punching and bending a conductive metal plate into a predetermined shape, and, as shown in FIGS. 4, 6, 7, 9, and 10, integrally has: a cable connecting portion lower surface cover portion 31a which is opposed to the cable connecting portion upper surface cover portion 30b; and a pair of cable connecting portion side surface outer cover portion 31b which are bent from the lateral side edges of the cable connecting portion lower surface cover portion 31a to upwardly extend, respectively. The shell cover 31 has a U-like shape which is opened in the front, rear, and upper sides.

The cable connecting portion metal cover portion 30 and the shell cover 31 are fixed to each other in a state where the cable connecting portion metal cover portion 30 is fitted into the shell cover 31 from the upper opening, and the cable connecting portion side surface outer cover portion 31b overlaps the outsides of the cable connecting portion side surface inner cover portions 30c, thereby allowing the lower opening of the cable connecting portion metal cover portion 30 to be closed by the cable connecting portion lower surface cover portion 31a. In this state, as shown in FIG. 4, the cable connecting portion metal cover portion 30 and the shell cover 31 are integrally formed into a tubular shape which is opened only in the front and rear sides, in such a manner that the outer circumferences of the cable connecting portion basal portion 23a, the printed circuit board 27, and the four core wires 11 which are exposed on the side of the one end of the cable 10 are covered as shown in FIG. 6.

In the cable connecting portion metal cover portion 30, as shown in FIGS. 4, 6, and 8 to 10, a cable connecting piece 30d which rearwardly extends from a central portion of the rear end edge of the cable connecting portion upper surface cover portion 30b, and a shield contacting piece 30e which is disposed in a state where it is projected from the rear end of the cable connecting piece 30d are integrally formed. In the shell cover 31, as shown in FIGS. 4, 6, 7, 9, and 10, a cable connecting piece 31c which rearwardly extends from a central portion of the rear end edge of the cable connecting portion lower surface cover portion 31a, and a shield coupling piece 31d which is disposed in a state where it is projected from the rear end of the cable connecting piece 31c, and which has a U-like that is upwardly opened are integrally formed. As shown in FIGS. 4 and 6, the shield coupling piece 31d is tightened and fixed in a state where the shield contact piece 30e is embraced in the outer circumferential surface (outer circumferential surface of the outer shield 12b) of the shield 12 which is exposed on the side of the one end of the cable 10, whereby the plug-side metal shell 25 and shell cover 31 which are shield members for the plug 20 are connected and fixed to the cable 10 in a state where they are coupled and integrated to the shield 12 of the cable 10. Alternatively, a configuration may be employed where the shield coupling piece 31d is disposed in the cable connecting portion metal cover portion 30, and the shield contact piece 30e is disposed in the shell cover 31. In the case where the shell cover 31 is not disposed, the shield coupling piece 31d is disposed in the cable connecting portion metal cover portion 30.

When the thus configured plug 20 is connected (fitted) to the receptacle 1 as shown in FIG. 12, the cable 10 can be connected to a small portable electronic device on which the receptacle 1 is mounted. Namely, the plug portion 22 is inserted into the plug inserting portion 2 in a state where the cover portion 21 is held and the front end surface of the plug portion 22 is opposed to the front surface of the receptacle 1. Then, the terminal supporting portion 6b is inserted into the terminal supporting portion inserting portion 26 through the gap between the tubular plug-side metal shell 25 which is exposed in the terminal supporting portion inserting portion 26 from the upper side, and the contacting portions 24c of the plug-side contacting terminals 24 which are exposed in the terminal supporting portion inserting portion 26 from the lower side, i.e., the spatial distance C. In accordance with this, the contacting portions 24c of the plug-side contacting terminals 24 are pressed down by the lower surfaces of the contact pieces 4a of the receptacle-side contacting terminals 4, and the elastic contact pieces 24b of the plug-side contacting terminals 24 are elastically deformed. When the plug portion 22 is further inserted into the plug inserting portion 2 in this state, the contacting portions 24c of the plug-side contacting terminals 24 slide over the lower surfaces of the contact pieces 4a of the receptacle-side contacting terminals 4. In a state where the plug portion 22 is completely inserted into the plug inserting portion 2 (the plug portion 22 is latchingly prevented from slipping off), the plug 20 is connected to the receptacle 1 as shown in FIG. 12, the contacting portions 24c of the plug-side contacting terminals 24 are pressingly contacted with the contact pieces 4a of the receptacle-side contacting terminals 4 from the lower side, and the plug-side contacting terminals 24 and the receptacle-side contacting terminals 4 are conductively connected to each other, respectively. As a result, the cable 10 is connected to the small portable electronic device.

In the case where a USB connector (plug) according to, for example, the micro-USB (2.0) standard is disposed in the other end of the cable 10, and the USB connector (plug) is connected to a PC, peripheral device, or the like on which a USB connector (receptacle) is mounted, data can be transferred between the small portable electronic device and the PC or the peripheral device. In the case where the USB connector (plug) is connected to a PC or charger such as an AC adapter or a mobile battery on which a USB connector (receptacle) is mounted, a charging current can be supplied from the connected power supply to the small portable electronic device.

When, in the state where the plug 20 is connected to the receptacle 1 (FIG. 12), the cover portion 21 is held, and the plug portion 22 is pulled out from the plug inserting portion 2, the press down of the contacting portions 24c of the plug-side contacting terminals 24 by the contact pieces 4a of the receptacle-side contacting terminals 4 is eliminated, with the result that, as shown in FIGS. 5 and 6, the elastic contact pieces 24b of the plug-side contacting terminals 24 return to their original free state, and the contacting portions 24c of the plug-side contacting terminals 24 are again opposed to the plug-side metal shell 25 in the upper side through the spatial distance C.

The thus configured plug 20 can be assembled to the one end of the cable 10 in the following procedure. Namely, the plug-side contacting terminals 24 are inserted and attached into the plug body 23. Then, the corresponding plug-side connector terminal connecting portions 28a to 28d of the printed circuit board 27 are soldered respectively to the board connection pieces 24e of the plug-side contacting terminals 24, and the printed circuit board 27 is supported just in rear of the plug body 23 through the plug-side contacting terminals 24. Next, the corresponding conductors 11a of the core wires 11 which are exposed on the side of the one end of the cable 10 are soldered respectively to the cable connecting portions 29a to 29d of the printed circuit board 27, and the conductors 11a of the core wires 11 in the cable 10 are connected to the corresponding plug-side contacting terminals 24 through the printed circuit board 27. Next, the plug body 23 is fitted into the cable connecting portion metal cover portion 30 from the rear end opening or the lower opening, the plug basal portion 23b is fitted into the plug-side metal shell 25 from the rear end opening, and the cable connecting portion basal portion 23a, the printed circuit board 27, and the four core wires 11 which are exposed on the side of the one end of the cable 10 are housed in the cable connecting portion metal cover portion 30. Next, the cable connecting portion metal cover portion 30 is fitted into the shell cover 31 from the upper opening, and the cable connecting portion basal portion 23a, the printed circuit board 27, and the four core wires 11 which are exposed on the side of the one end of the cable 10 are covered by the plug-side metal shell 25 and the shell cover 31. Next, the shield coupling piece 31d is tightened and fixed in the state where the shield contact piece 30e is embraced in the outer circumferential surface of the shield 12 which is exposed on the side of the one end of the cable 10. As a result, a semifinished product of the plug indicated by the solid lines in FIG. 4 is completed. Then, the semifinished product of the plug is loaded into a cavity of an injection mold, and the cable connecting portion metal cover portion 30 and the shell cover 31 are covered by an overmold resin to mold the cover portion 21 indicated by the dash-dot-dot lines in FIG. 4, thereby completing a product of the plug 20. Also the interiors of the cable connecting portion metal cover portion 30 and the shell cover 31 are filled with the overmold resin.

Then, the gist configuration of the invention will be described. As shown in FIG. 11, the plug 20 includes a thermal protection circuit 32 which detects abnormal heating to cut off the power supply.

As shown in FIG. 11, the thermal protection circuit 32 includes a temperature switch IC 33 which detects the temperature, and an incorporated N-channel FET (Field-Effect Transistor) 34. The temperature switch IC 33 is mounted on the upper surface of the printed circuit board 27 to which the cable connecting portion upper surface cover portion 30b that is integrally formed in the plug-side metal shell 25 is opposed (FIGS. 6 and 7).

The cable connecting portion 29a for power supply (Vcc) is connected to the drain (D) of the N-channel FET 34, and the terminal connecting portion 28a for power supply (VBUS) is connected to the source (S) of the N-channel FET 34. Namely, the temperature switch IC 33 incorporating the N-channel FET 34 is inserted into a power supply line (a part of a current path) of the printed circuit board 27 in which the cable connecting portion 29a for power supply (Vcc) and the terminal connecting portion 28a for power supply (VBUS) are conductively connected to each other.

In the temperature switch IC 33, a temperature sensor which is incorporated therein detects the temperature. As the temperature sensor, for example, a thermistor (resistor element), a temperature sensor IC (semiconductor devices such as transistors and diodes), or the like may be used. In the temperature switch IC 33, when the temperature sensor portion detects a predetermined temperature (temperature corresponding to abnormal heating to be detected: for example, 100° C.), the N-channel FET 34 is turned OFF. At this time, the surface temperature of the plug 20 is lower than the value. The cable connecting portion 29a for power supply (Vcc) is connected to a power supply terminal of the temperature switch IC 33, and a ground terminal of the temperature switch IC 33 is connected to the cable connecting portion 29b for grounding (GND).

The operation of the thermal protection circuit 32 will be described with reference to FIG. 11. Here, a situation is assumed where the plug 20 disposed in the one end of the cable 10 is connected to the receptacle 1 in order to charge a smart phone or the like on which the receptacle 1 is mounted, the other end of the cable 10 is connected to, for example, a main unit of an AC adapter through the USB connector, and a power supply plug of the AC adapter is connected to an outlet.

Operation when Plug 20 is in Normal Heating State

In the case where there is no abnormality in a current supply circuit existing between the power supply (AC 100 V) and a secondary battery incorporated in the smart phone, for example, a current which is about 1 A and 2 A at a peak flows through the plug 20, the plug 20 is in a normal heating state, and the N-channel FET 34 incorporated in the temperature switch IC 33 is in the ON state to supply the current to the smart phone.

Operation when Plug 20 Abnormally Generates Heat

In the case where any abnormality occurs in the current supply circuit and the current is increased, the plug 20 abnormally generates heat, and, when the detected temperature of the temperature switch IC 33 exceeds the predetermined temperature, the detection output of the temperature switch IC 33 becomes HIGH (power supply voltage level)

(abnormal heating signal). When the detection output of the temperature switch IC 33 is HIGH, the N-channel FET 34 is in the OFF state to cut off the power supply to the smart phone. When the power supply to the smart phone is cut off, the abnormal heating of the plug 20 is ceased. A configuration is preferably employed where, when the detected temperature of the temperature switch IC 33 exceeds the predetermined temperature for a time period which is equal to or longer than a time period determined by the capacitance, the detection output of the temperature switch IC 33 becomes HIGH.

Operation After Cutting Off

When abnormal heating is once detected and the N-channel FET 34 incorporated in the temperature switch IC 33 is turned OFF, this state is held (latched) by a flip-flop circuit. Even when the abnormal heating of the plug 20 is once ceased, and the detected temperature of the temperature switch IC 33 becomes lower than the predetermined temperature, therefore, the current supply (charging) is not restarted, and a situation where abnormal heating again occurs is not caused. When the power supply plug of the AC adapter is pulled out from the outlet, and the power supply voltage of the temperature switch IC 33 is equal to or lower than the predetermined voltage level, the latched state of the temperature switch IC 33 is reset. Even when the user extracts and inserts the plug 20 from and into the receptacle 1 to restart the charging, therefore, abnormal heating does not again occur.

In the above-described configuration, the plug 20 includes: the cover portion (connecting portion with respect to the cable 10) 21 into which one end of the cable 10 is inserted, and which is made of an insulating synthetic resin; the plug portion (connecting portion with respect to the receptacle 1) 22 which is supported in the state where the plug portion is projected from the tip end of the cover portion 21, and which is to be inserted into the receptacle 1; and the printed circuit board 27 which is placed in the cover portion 21, the plug portion 22 includes: the plug body 23; the plurality of plug-side contacting terminals 24 which are supported by the plug body 23; and the plug-side metal shell 25 which covers the outer circumference side of the plug body 23, the thermal protection circuit 32 is mounted on the printed circuit board 27, the thermal protection circuit 32 includes the temperature switch IC (temperature sensor portion) 33 which detects the temperature, and the FET 34 which is incorporated in the temperature switch IC 33, and, in the temperature switch IC 33, the power supply line is cut off by the FET 34 when the detected temperature exceeds the predetermined temperature. As described above, the thermal protection circuit 32 is prone to show a higher sensitivity to abnormal heating in the cover portion 21, and a lower sensitivity to abnormal heating in the plug portion 22.

In the above-described configuration, the plug 20 further includes the cable connecting portion upper surface cover portion 30b which is formed integrally with the plug-side metal shell 25, and which extends from the metal shell 25 into the cover portion 21 so as to be opposed to the temperature switch IC 33, and heat of the plug portion 22 is transmitted somewhat more easily to the cover portion 21 than a plug which does not include the cover portion. However, the cable connecting portion upper surface cover portion 30b is not a portion through which the plug-side metal shell 25 and the temperature switch IC 33 are thermally coupled to each other to positively and efficiently transmit heat of the plug portion 22 to the temperature switch IC 33. It remains difficult to cut off the power supply with high sensitivity to abnormal heating in the plug portion 22.

The plug 20 is a micro USB plug which has a small size and low strength, and in which the plug portion 22 is therefore easily deformable. In the plug 20, there is a case where the protection circuit which is usually incorporated in an output-side device does not operate, and the plug portion 22 abnormally generates heat, and, in the case of abnormal heating in the plug portion 22, it is necessary to cut off the power supply with high sensitivity.

Abnormal heating in the plug portion 22 will be described with reference to FIGS. 13 and 14. Also in this case, a situation is assumed where the plug 20 disposed in the one end of the cable 10 is connected to the receptacle 1 in order to charge a smart phone on which the receptacle 1 is mounted, the other end of the cable 10 is connected to, for example, a main unit of an AC adapter through the USB connector, and a power supply plug of the AC adapter is connected to an outlet.

a The plug 20 is a micro USB plug which has a small size and low strength, and the plug portion 22 is easily deformed by a prying load or the like. The spatial distance C between the contacting portions 24c of the plug-side contacting terminals 24 which are exposed in the terminal supporting portion inserting portion 26 of the plug portion 22, and the plug-side metal shell 25 is short. In the case where the plug portion 22 is deformed, when the plug portion 22 is pulled out from the receptacle 1, therefore, there is a possibility that the contacting portions 24c of the plug-side contacting terminals 24 approach the plug-side metal shell 25 to be contacted therewith, beyond the spatial distance C in a front end portion (tip end portion) of the plug portion 22.

b The timings of contacts in a above are seldom matched to each other. When, in a state where one of the contacting portions 24c of the plug-side contacting terminals 24 for power supply (VBUS) and grounding (GND) is completely contacted with the plug-side metal shell 25, the other contacting portion approaches the metal shell (not completely contacted therewith), an arc is generated between the approaching contacting portion 24c of the plug-side contacting terminal 24 and the plug-side metal shell 25.

c Because of the arc, a resistance component is produced in the surface of the metal of the place where the arc is generated. That is, the metal surface is carbonized, and the resistance of the metal surface is increased.

d When both the contacting portions 24c of the plug-side contacting terminals 24 for power supply (VBUS) and grounding (GND) are contacted with the plug-side metal shell 25, both the contacting portions 24c are short-circuited through the plug-side metal shell 25, and an over current flows through the plug 20. However, a protection circuit which is usually incorporated in the AC adapter operates, and the current does not flow as it is.

e When b and c above are repeated by, for example, continuous use of the plug 20, the carbonization of the metal surface of the place where the arc is generated proceeds, and the resistance of the metal surface is gradually increased. When the resistance exceeds a certain value, both the plug-side contacting terminals 24 are short-circuited through the plug-side metal shell 25. In this case, even when a current flows through the plug 20, the protection circuit which is incorporated in the AC adapter does not operate because the resistance of the metal surface of the place where the arc is generated is high. Therefore, the current flows as it is, and the front end portion of the plug portion 22 abnormally generates heat.

In the plug 20, as shown in FIGS. 4, 6, 7, 9, 10, and 14, however, the cable connecting portion upper surface cover portion 30b is formed integrally with the plug-side metal shell 25, and extends from the metal shell 25 into the cover portion 21 so as to be opposed to the temperature switch IC 33. Moreover, a heat transferring portion 35 which is in contact with the temperature switch IC 33 is formed in the place of the cable connecting portion upper surface cover portion 30b where the portion is opposed to the temperature switch IC 33, and the cable connecting portion upper surface cover portion 30b is disposed as a metal bonding member 36 which thermally couples the plug-side metal shell 25 to the temperature switch IC 33.

In this way, the plug-side metal shell 25 which is a cover for the plug portion 22 is caused by the metal bonding member 36 to be thermally coupled to the temperature switch IC 33, whereby heat of the plug portion 22 can be positively and efficiently transmitted to the temperature switch IC 33, and the power supply can be cut off with high sensitivity with respect to abnormal heating in the plug portion 22. When the plug portion 22 is inserted into the receptacle 1, the power supply can be cut off with high sensitivity with respect to abnormal heating on the side of the receptacle (on the side of the smart phone). Moreover, the metal bonding member 36 is formed as a component integral with the plug-side metal shell 25, and therefore the plug 20 can include the metal bonding member 36 without increasing the numbers of components of the plug and steps of assembling the plug.

In the plug 20, as shown in FIGS. 4, 6, 7, 9, 10, and 14, the heat transferring portion 35 is configured by an elastic piece 35a.

When the heat transferring portion 35 configured by the elastic piece 35a is formed as described above, the heat transmitting portion 35 can be surely contacted (in close contact) with the temperature switch IC 33 while absorbing variations of the product dimensions of the plug 20. In assembling of the plug 20, specifically, in the case where the plug body 23 is fitted into the cable connecting portion metal cover portion 30, and the plug basal portion 23b is fitted into the plug-side metal shell 25 from the rear end opening, moreover, it is possible to prevent the heat transmitting portion 35 from applying an excessive load on the temperature switch IC 33.

As shown in FIGS. 6, 7, 9, 10, and 14, the plug 20 further includes a thermally conductive resin sheet 37 which is stuck to one of the contact surfaces of the heat transmitting portions 35, 35a and the temperature switch IC 33, and which is interposed between the contact surfaces of the heat transmitting portions 35, 35a and the temperature switch IC 33. As the thermally conductive resin sheet 37, for example, a sheet member made of an insulating synthetic resin with high thermal conductivity, such as a silicone resin may be used.

When the thermally conductive resin sheet 37 is stuck to one of the contact surfaces of the heat transmitting portions 35, 35a and the temperature switch IC 33 as described above, the thermally conductive resin sheet 37 can function as a shock-absorbing member in assembling of the plug 20, to prevent the heat transmitting portions 35, 35a from applying an excessive load on the temperature switch IC 33. The thermally conductive resin sheet 37 may be configured in any way as far as it can play a role of a shock-absorbing member while maintaining the efficiency of the heat transfer between the heat transmitting portions 35, 35a and the temperature switch IC 33.

Since the plug 20 is a micro USB plug, abnormal heating can be detected in the micro USB plug to cut off the power supply. Moreover, the power supply can be cut off with high sensitivity with respect to abnormal heating in the plug portion 22.

Next, a connector of another embodiment of the invention will be described with reference to FIGS. 15 to 22B. Also the connector of the embodiment is a plug according to the micro-USB (2.0) standard, and using the receptacle 1 shown in FIGS. 1, 2, and 12 as the mating connector. Namely, the connector is a plug to be disposed in the cable 10 shown in FIG. 3, and hereinafter referred to as "plug". In the plug 200 of the embodiment, the same components as those of the above-described plug 20 are denoted by the identical reference numerals, and duplicate description is omitted.

In the above-described plug 20, the cable connecting portion upper surface cover portion 30b of the cable connecting portion metal cover portion 30 which is formed integrally with the plug-side metal shell 25 is disposed as the metal bonding member 36. In the plug 200 of the embodiment, as shown in FIGS. 15 and 18 to 21, by contrast, the cable connecting portion metal cover portion 30 is not formed integrally with the plug-side metal shell 25, and, as shown in FIGS. 15, 18, and 22A, a metal bonding member 360 which is formed separately from the plug-side metal shell 25 is disposed.

In the plug 200 of the embodiment, as shown in FIGS. 15 and 18 to 21, a pair of upper and lower engagement pieces 251, 252 are formed integrally with the plug-side metal shell 25. The upper engagement piece 251 is bent from the upper edge of the rear end of the plug-side metal shell 25, upwardly extends along the front surface of the cable connecting portion basal portion 23a, is then further bent to rearwardly extend, and overlaps the upper surface of the cable connecting portion basal portion 23a. The lower engagement piece 252 is bent from the lower edge of the rear end of the plug-side metal shell 25, downwardly extends along the front surface of the cable connecting portion basal portion 23a, is then further bent to rearwardly extend, and overlaps the lower surface of the cable connecting portion basal portion 23a. The plug-side metal shell 25 is fixed to the plug body 23 in a slipping-off prevention manner by engaging an engagement hole 251a formed in a tip end portion of the upper engagement piece 251, with an engagement claw 223a which is projected from the upper surface of the cable connecting portion basal portion 23a, and engaging an engagement hole 252a formed in a tip end portion of the lower engagement piece 252, with an engagement claw 223b which is projected from the lower surface of the cable connecting portion basal portion 23a.

Figure 15:
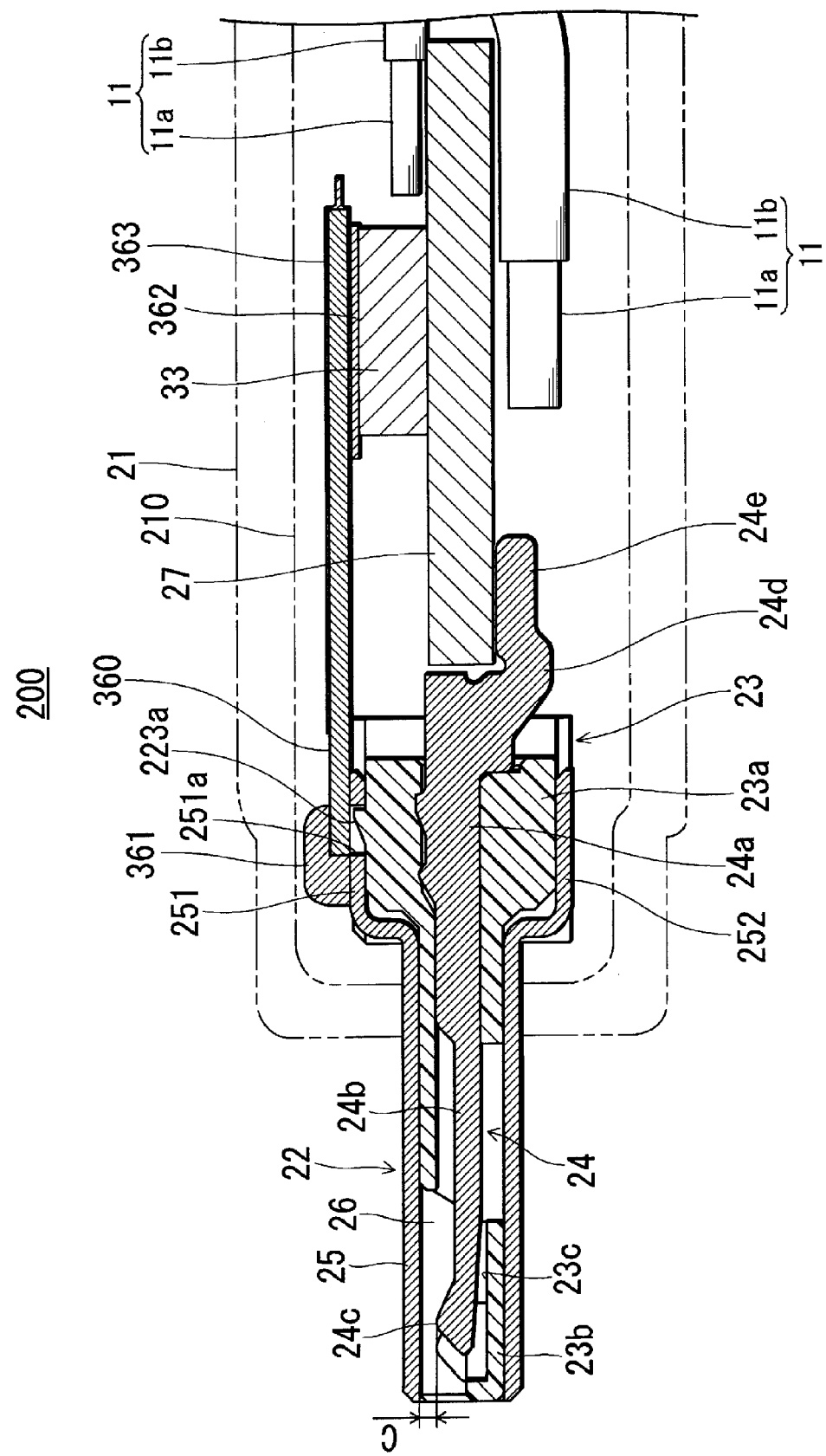
FIG. 15 is a side sectional view of a connector which is another embodiment of the invention.
Figure 18:
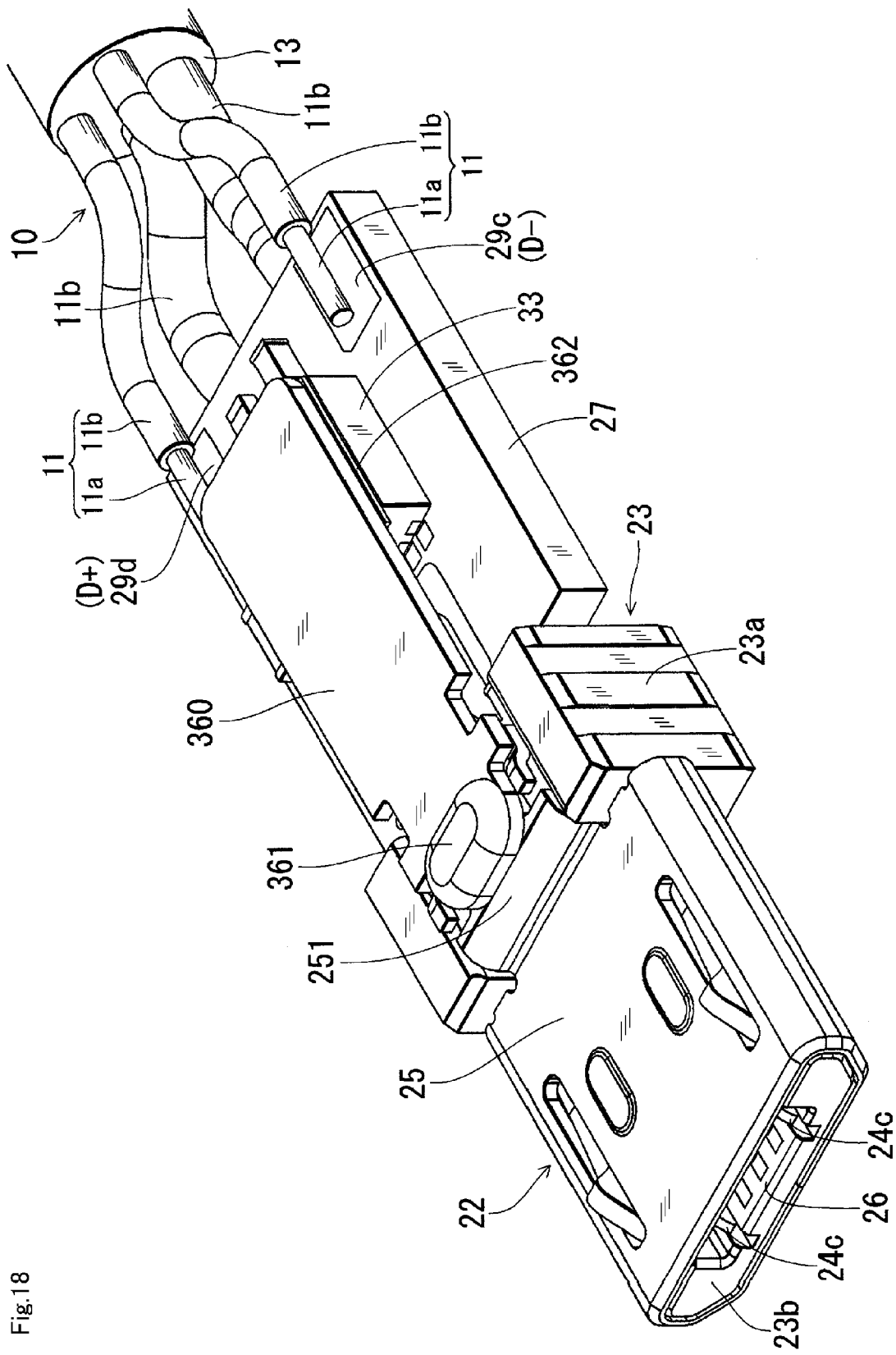
FIG. 18 is a perspective view of a state where an inner mold in FIG. 17 is made transparent.
Figure 22A:
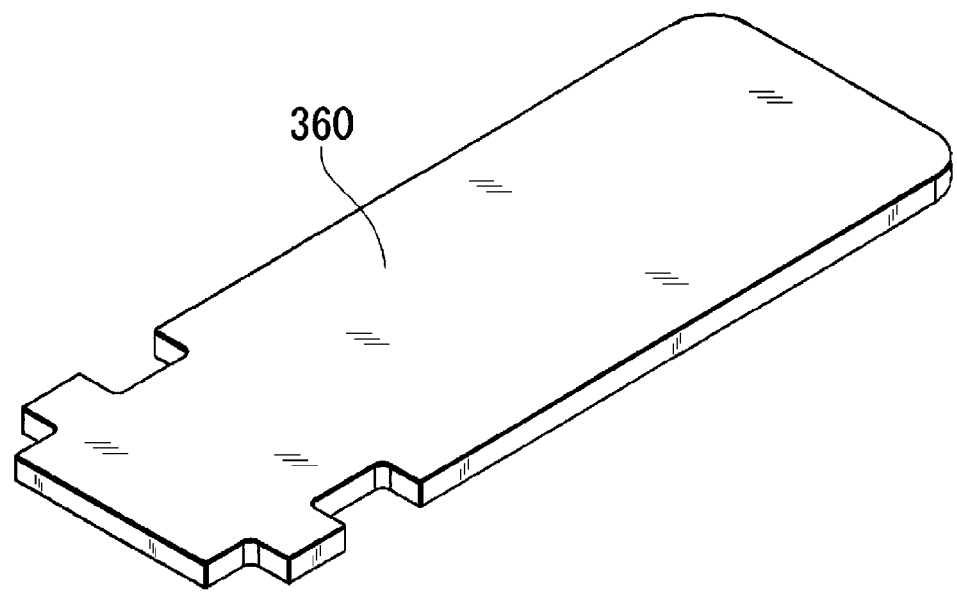
FIG. 22A is a perspective view of the metal bonding member.

In the plug 200 of the embodiment, as shown in FIGS. 15, 18, and 22A, the metal bonding member 360 is configured by a rectangular planar metal piece, integrated with the plug-side metal shell 25 by solder 361 (soldering) in a closely contacted state where the front end overlaps the upper engagement piece 251, and rearwardly extends from the upper engagement piece 251. The tip end (rear end) is closely contacted with the upper surface of the temperature switch IC 33.

In the plug 200 of the embodiment, as described above, the plug-side metal shell 25 which is a cover for the plug portion 22 is thermally coupled to the temperature switch IC 33 by the metal bonding member 360 which is formed separately from the metal shell, and the power supply can be cut off with high sensitivity with respect to abnormal heating in the plug portion 22. Since the metal bonding member 360 is formed separately from the plug-side metal shell 25, the production costs of the metal bonding member 360 and the plug-side metal shell 25 can be reduced as compared with the case where, as in the above-described plug 20, the metal bonding member 360 and the plug-side metal shell 25 are formed integrally with each other.

In the plug 200 of the embodiment, in order to eliminate a gap between the metal bonding member 360 and the temperature switch IC 33, the member and the switch are bonded and fixed to each other by a double-sided adhesive tape 362 having the insulation property as shown in FIGS. 15 and 18. As the double-sided adhesive tape 362, preferably, a tape with high thermal conductivity and high heat resistance may be used.

Figure 22B:
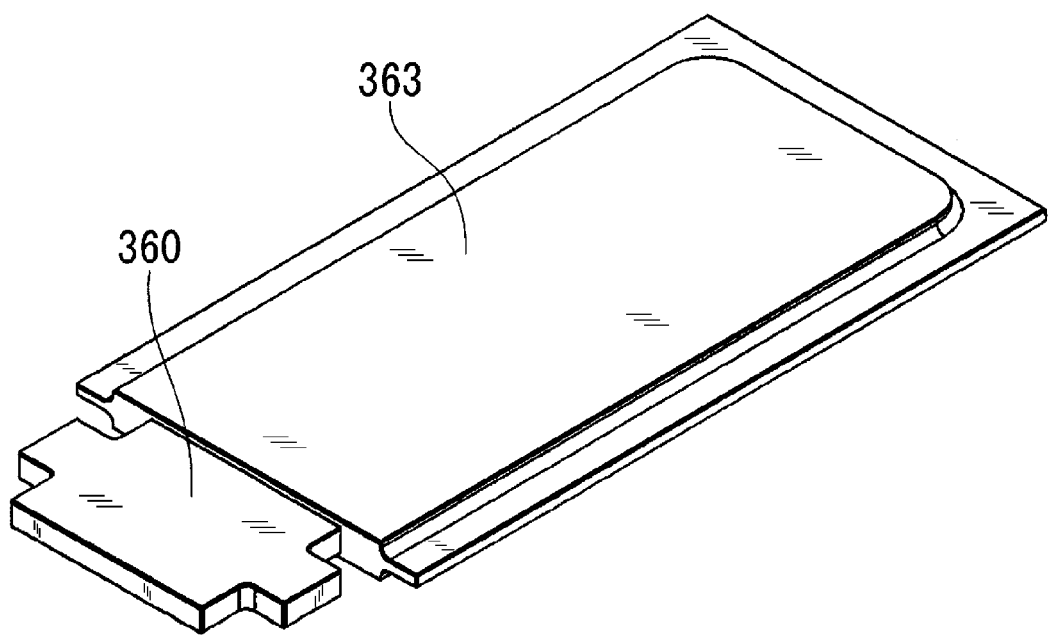
FIG. 22B is a perspective view of a state where the metal bonding member is insulation-coated.

In the plug 200 of the embodiment, in order to ensure the insulation property, the metal bonding member 360 other than a front end portion is covered by an insulator 363 as shown in FIGS. 15 and 22B. Specifically, the metal bonding member 360 excepting a front end portion is covered in a bag shape by a single-sided adhesive tape with high heat resistance such as a Kapton (registered trademark) tape having a polyimide or polyetheretherketone tape substrate. As the insulator 363, preferably, an insulator with high thermal conductivity may be used.

Figure 16:
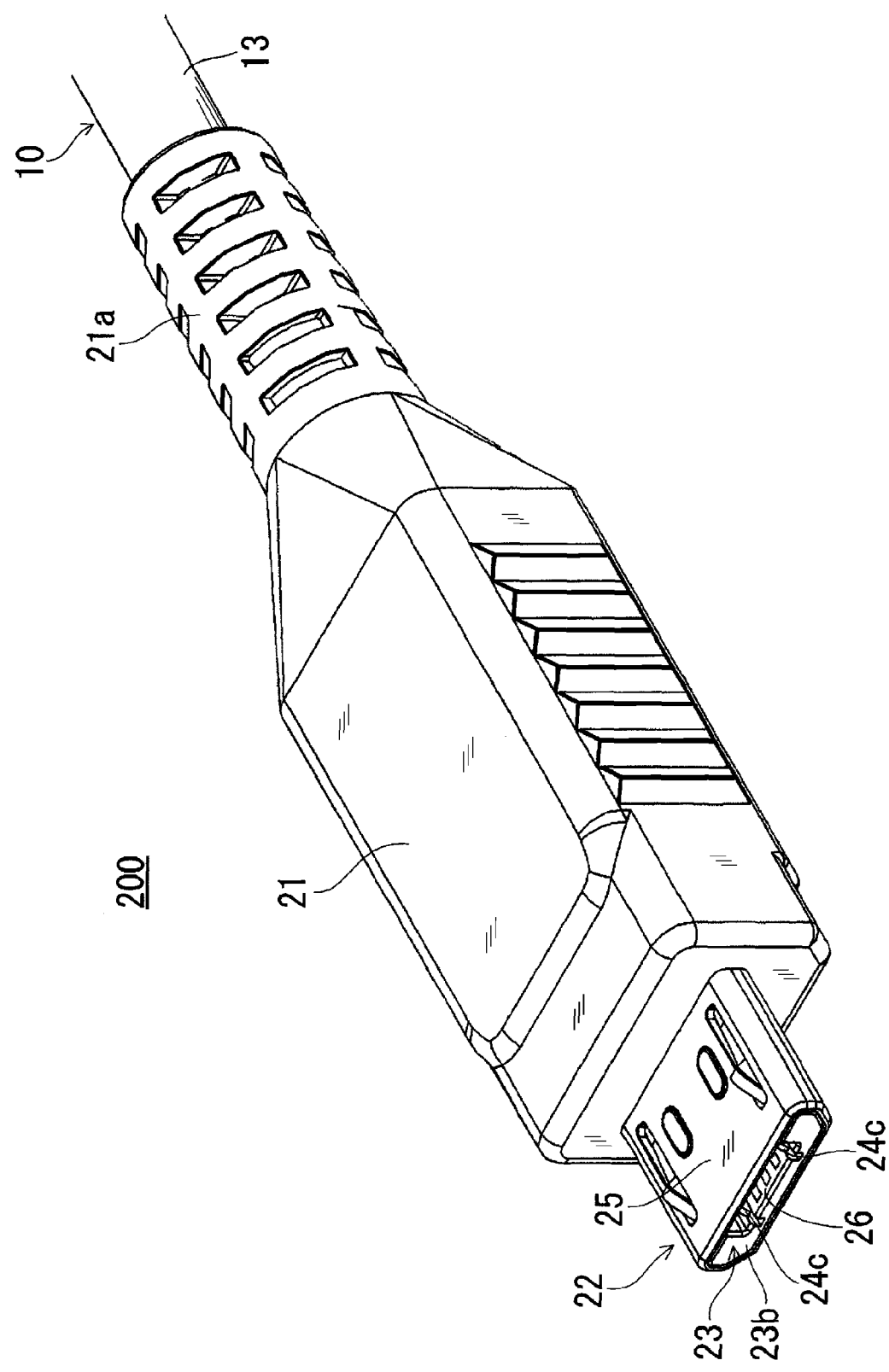
FIG. 16 is a perspective view showing the appearance of the connector of FIG. 15.
Figure 17:
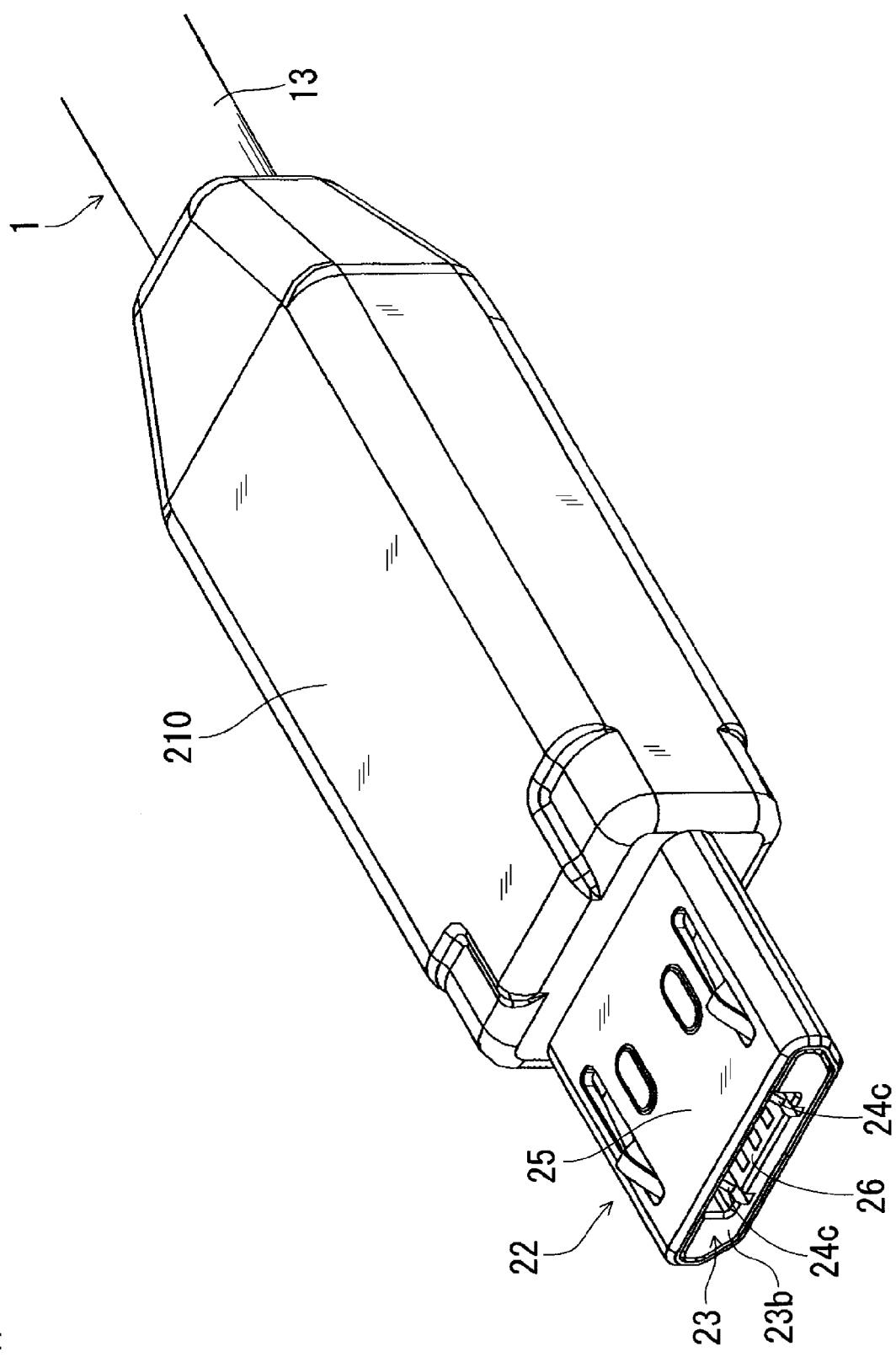
FIG. 17 is a perspective view of a state where an over mold in FIG. 16 is made transparent.

The plug 200 of the embodiment does not include the cable connecting portion metal cover portion 30 and the shell cover 31. Instead, as shown in FIGS. 15 to 17, an inner mold 210 which is made of an insulating synthetic resin is formed by insert molding around the cable connecting portion basal portion 23a, the printed circuit board 27, the four core wires 11 exposed from the end of the cable 10, and an end portion of the cable 10, and thereafter an over mold made of an insulating synthetic resin, i.e., the cover portion 21 is formed by insert molding around the inner mold 210.

Figure 19:
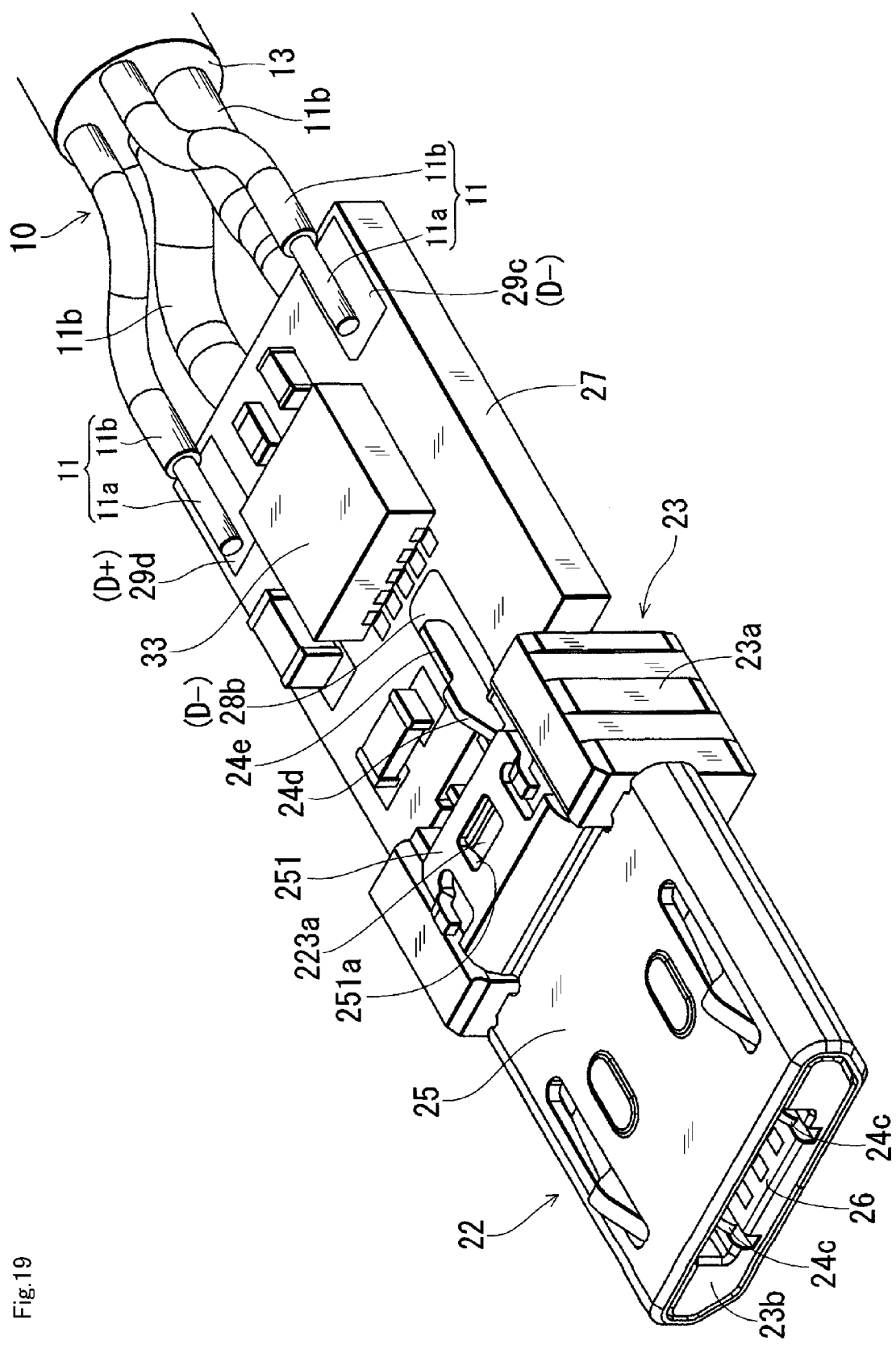
FIG. 19 is a perspective view of a state where a metal bonding member in FIG. 18 is made transparent.
Figure 20:
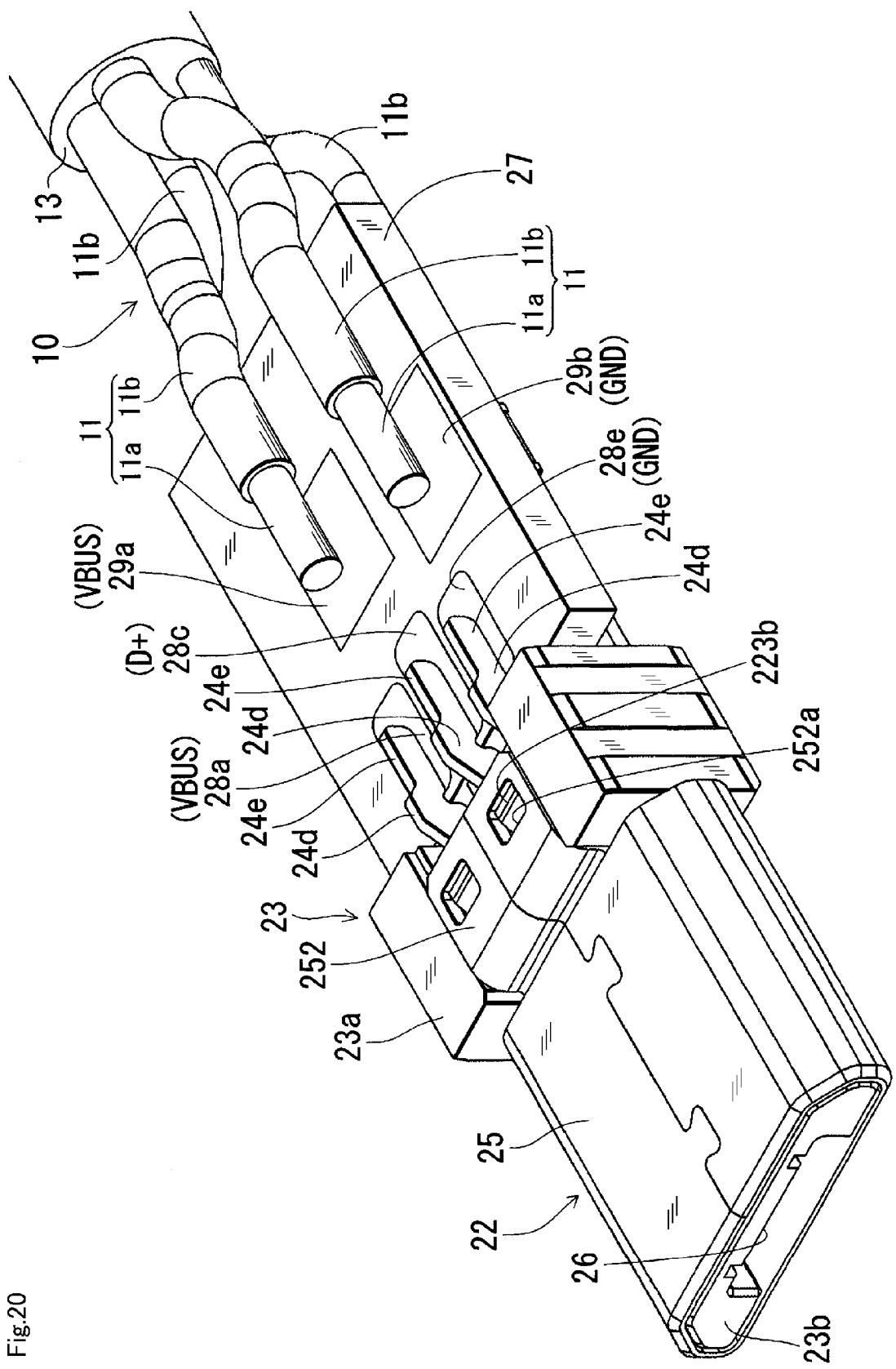
FIG. 20 is a perspective view of a state where the connector of FIG. 18 is turned over.
Figure 21:
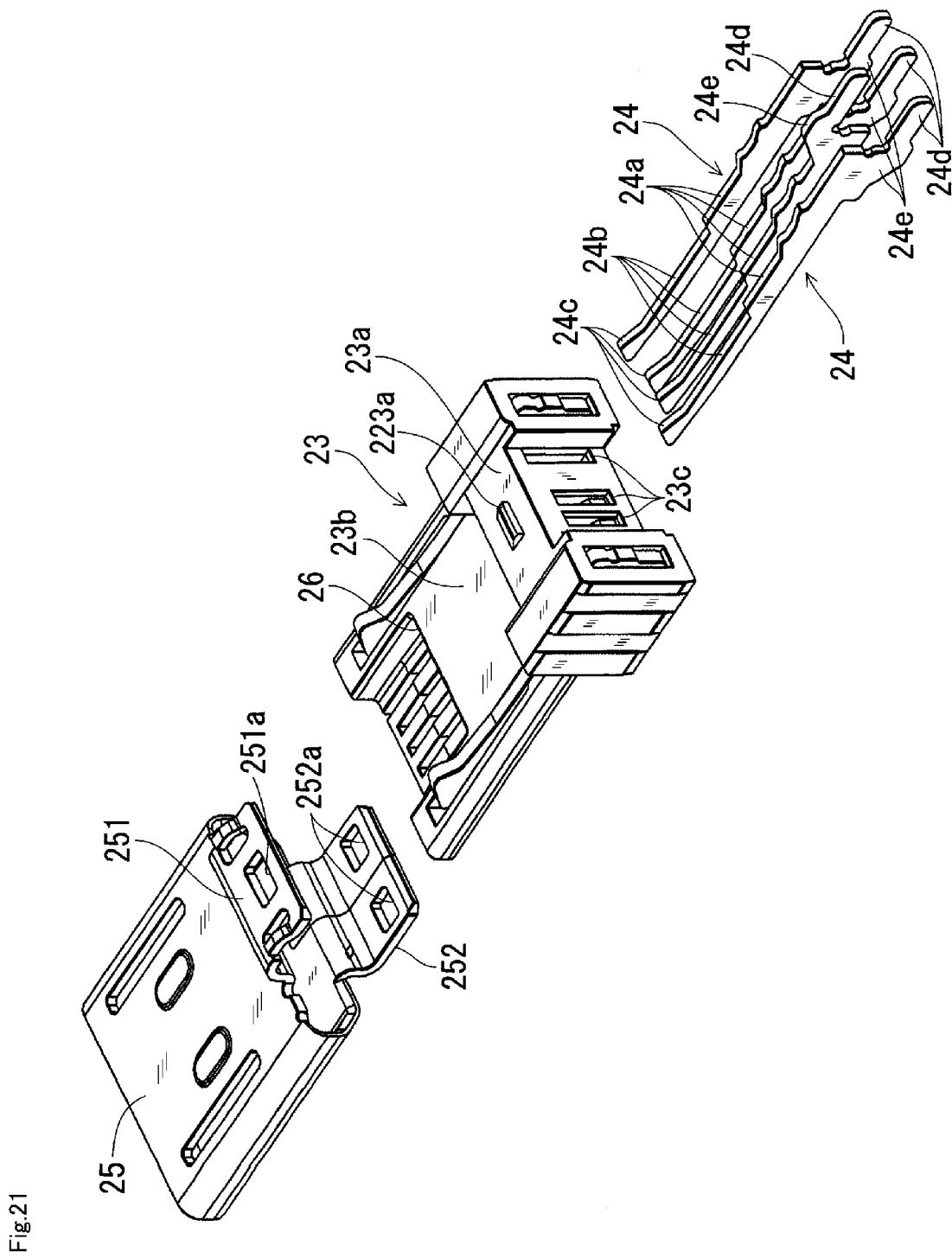
FIG. 21 is an exploded perspective plan view of the plug portion.

Among the plug-side contacting terminals 24, as shown in FIGS. 19 to 21, only the four terminals other than the terminal for identification are supported by the plug body 23. The terminal housing portion 23c for the terminal for identification is not passed through the rear end surface of the cable connecting portion basal portion 23a. In molding of the inner mold 210, the molten resin is prevented from moving from the terminal housing portion 23c for the terminal for identification to the terminal supporting portion inserting portion 26.

DESCRIPTION OF REFERENCE NUMERALS 1 receptacle (mating connector)
10 cable
20 plug (connector)
21 cover portion
22 plug portion
23 plug body
24 plug-side contacting terminal
25 plug-side metal shell
27 printed circuit board
30b cable connecting portion upper surface cover portion
32 thermal protection circuit
33 temperature switch IC
34 FET
35, 35a heat transferring portion
36 metal bonding member
37 thermally conductive resin sheet
200 plug (connector)
360 metal bonding member

The invention claimed is:

1. A connector wherein the connector has:
a cover portion into which one end of a cable is inserted, and which is made of an insulating synthetic resin;
a plug portion, which is supported in a state where the plug portion is projected from a tip end of the cover portion, which is to be inserted into a mating connector, and which includes: an insulator; a plurality of contact terminals that are supported by the insulator; and a metal shell, which covers an outer circumference side of the insulator,
a printed circuit board, which is placed in the cover portion, and on which a thermal protection circuit is mounted,
the thermal protection circuit includes:
an FET, which is inserted in a power supply line of the printed circuit board; and
a temperature switch that detects a temperature, and which, when the detected temperature exceeds a predetermined temperature, outputs an abnormal heating signal for causing the FET to cut off the power supply line, and
the connector further includes a metal bonding member, said metal bonding member being formed integrally or integrated with the metal shell and thermally couples the metal shell to the temperature switch; wherein
the metal bonding member, other than a front end portion, is covered by a bag shaped insulator secured by single-sided adhesive tape.

2. The connector according to claim 1, wherein the FET is incorporated in the temperature switch.

3. The connector according to claim 1, wherein the connector is a plug according to the micro USB standard.

4. The connector according to claim 1, wherein the metal bonding member is configured by a metal plate member which is formed separately from the metal shell, which is integrated with the metal shell, and which extends from the metal shell to the temperature switch.

5. The connector according to claim 1, wherein the metal bonding member is configured by a metal plate member which is formed integrally with the metal shell, which extends from the metal shell into the cover portion so as to be opposed to the temperature switch, and in which a heat transmitting portion that is in contact with the temperature switch is formed.

6. The connector according to claim 5, wherein the heat transmitting portion is configured by an elastic piece.

7. The connector according to claim 5, wherein the connector further includes a thermally conductive resin sheet which is stuck to a contact surface of one of the heat transmitting portion and the temperature switch, and interposed between the contact surfaces of the heat transmitting portion and the temperature switch.

* * * * *